US012424285B2

(12) United States Patent
Tan

(10) Patent No.: US 12,424,285 B2
(45) Date of Patent: Sep. 23, 2025

(54) READ OFFSET COMPENSATION IN READ OPERATION OF MEMORY DEVICE

(71) Applicant: YANGTZE MEMORY TECHNOLOGIES CO., LTD., Wuhan (CN)

(72) Inventor: Hua Tan, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 115 days.

(21) Appl. No.: 18/113,616

(22) Filed: Feb. 23, 2023

(65) Prior Publication Data
US 2024/0233833 A1 Jul. 11, 2024

Related U.S. Application Data

(63) Continuation of application No. PCT/CN2023/070613, filed on Jan. 5, 2023.

(51) Int. Cl.
G11C 16/26 (2006.01)
G11C 16/04 (2006.01)
G11C 16/08 (2006.01)

(52) U.S. Cl.
CPC .......... G11C 16/26 (2013.01); G11C 16/0483 (2013.01); G11C 16/08 (2013.01)

(58) Field of Classification Search
CPC ...... G11C 16/26; G11C 16/0483; G11C 16/08
(Continued)

(56) References Cited

U.S. PATENT DOCUMENTS 11,483,014 B2* 10/2022 Kim ............... G11C 29/028
11,532,364 B2 12/2022 Kim
(Continued)

FOREIGN PATENT DOCUMENTS

CN 115206386 A 10/2022
CN 115565585 A 1/2023
(Continued)

OTHER PUBLICATIONS

International Search Report issued in corresponding International Application No. PCT/CN2023/070613, mailed Jun. 13, 2023, 3 pages.

Primary Examiner — Amir Zarabian
Assistant Examiner — Daniel J King
(74) Attorney, Agent, or Firm — BAYES PLLC

(57) ABSTRACT

A memory controller coupled to a memory device including an array of memory cells, each memory cell being set to one of $2^N$ states corresponding to a piece of N-bits data, where N is an integer greater than 1, and the array of memory cells being partitioned into one or more units. The memory controller is coupled to the memory device and configured to, upon executing instructions, obtain, from the memory device, a number P of memory cells in a unit of the units that are in one or more programmed states of the $2^N$ states; calculate, based on the number P, a compensated read voltage with an offset from a default read voltage; and provide, to the memory device, the compensated read voltage for a read operation performed on a selected memory cell of the memory cells in a unit of the units.

20 Claims, 16 Drawing Sheets

(58) Field of Classification Search
USPC .................................................. 365/185.18
See application file for complete search history.

(56) References Cited

U.S. PATENT DOCUMENTS

| | | |
|---|---|---|
| 2015/0261467 A1 | 9/2015 | Seo et al. |
| 2019/0206499 A1 | 7/2019 | Patel |
| 2020/0371910 A1* | 11/2020 | Ke .................... G06F 12/0246 |
| 2021/0089232 A1 | 3/2021 | Yamaki et al. |
| 2022/0293187 A1 | 9/2022 | Guo et al. |

FOREIGN PATENT DOCUMENTS

| | | |
|---|---|---|
| JP | 2021047695 A | 3/2021 |
| JP | 2021190150 A | 12/2021 |
| KR | 120150107405 A | 9/2015 |
| TW | I338897 B | 3/2011 |

\* cited by examiner

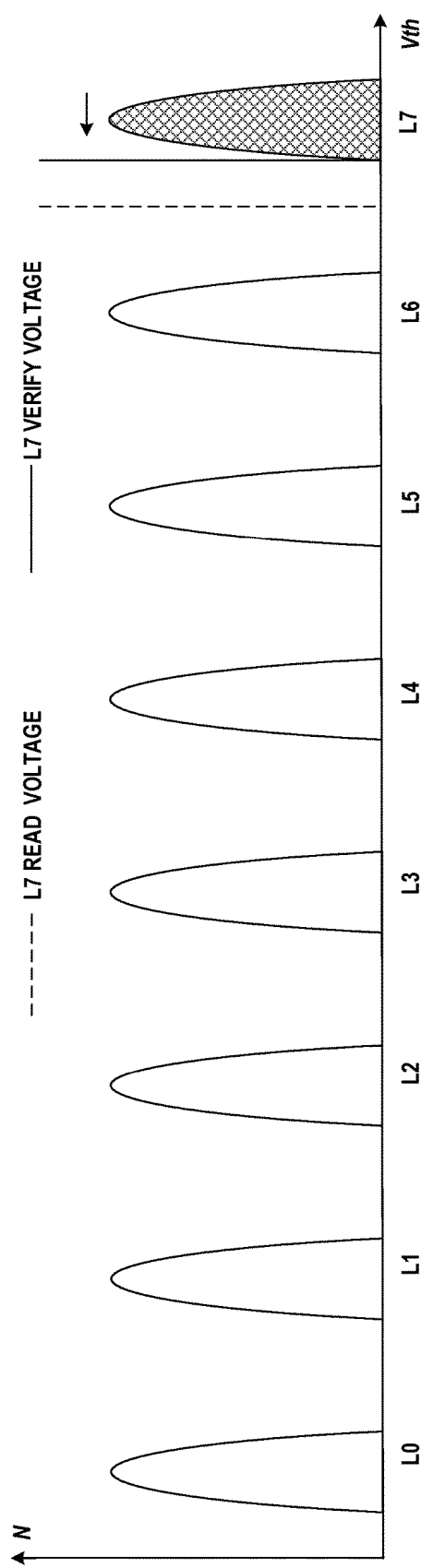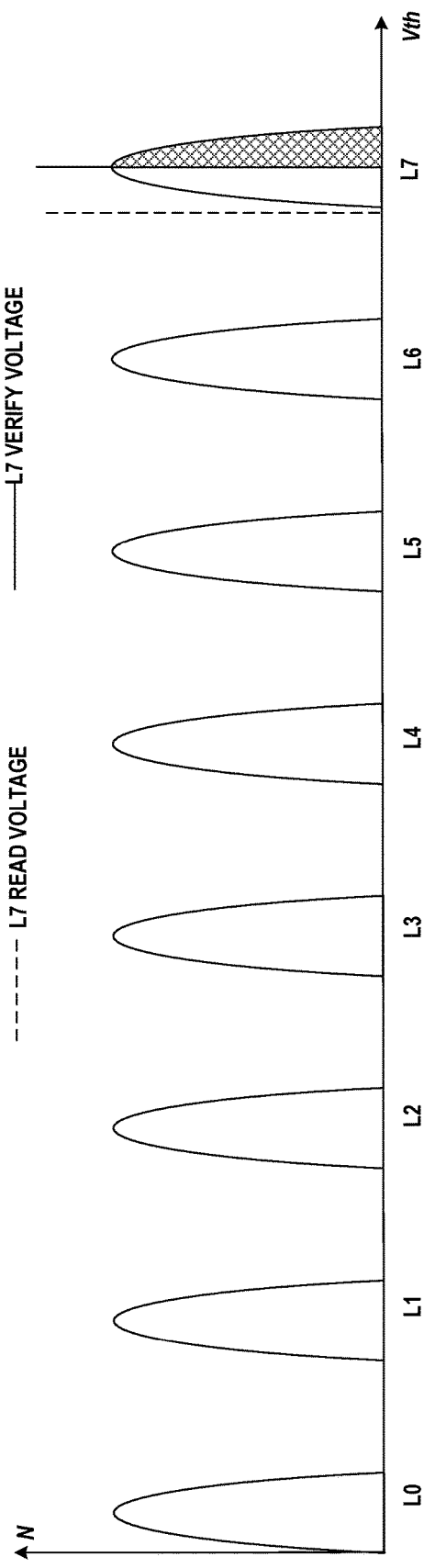
FIG. 10A
FIG. 10B

| Count of bit '0' | $M \sim \frac{15}{16}M$ | $\frac{15}{16}M \sim \frac{7}{8}M$ | $\frac{7}{8}M \sim \frac{3}{4}M$ | $\frac{3}{4}M \sim \frac{1}{2}M$ | $\frac{1}{2}M \sim \frac{1}{4}M$ | $\frac{1}{4}M \sim \frac{1}{8}M$ | $\frac{1}{8}M \sim \frac{1}{16}M$ | $< \frac{1}{16}M$ |
|---|---|---|---|---|---|---|---|---|
| Degree of charge loss | D0 | D1 | D2 | D3 | D4 | D5 | D6 | D7 |
| Read offset at L7 | 0 mV | -70 mV | -120 mV | -180 mV | -240 mV | -300 mV | -350 mV | Relocate the data |
| Read offset at L6 | 0 mV | -60 mV | -100 mV | -150 mV | -210 mV | -270 mV | -320 mV | Relocate the data |
| Read offset at L5 | 0 mV | -50 mV | -80 mV | -110 mV | -180 mV | -240 mV | -300 mV | Relocate the data |
| Read offset at L4 | 0 mV | -40 mV | -60 mV | -90 mV | -160 mV | -200 mV | -250 mV | Relocate the data |
| Read offset at L3 | 0 mV | -30 mV | -40 mV | -70 mV | -120 mV | -180 mV | -220 mV | Relocate the data |
| Read offset at L2 | 0 mV | -20 mV | -30 mV | -50 mV | -90 mV | -130 mV | -180 mV | Relocate the data |
| Read offset at L1 | 0 mV | -10 mV | -20 mV | -30 mV | -60 mV | -100 mV | -150 mV | Relocate the data |

FIG. 11

| Unit | | Unit 1 | Unit 2 | Unit 3 | ... | Unit N |
|---|---|---|---|---|---|---|
| Degree of charge loss | | D0 | D5 | D7 | ... | D5 |
| OFFSET (mV) | L7 | 0 | -300 | Relocate the data | ... | -300 |
| | L6 | 0 | -270 | Relocate the data | ... | -270 |
| | L5 | 0 | -240 | Relocate the data | ... | -240 |
| | L4 | 0 | -200 | Relocate the data | ... | -200 |
| | L3 | 0 | -180 | Relocate the data | ... | -180 |
| | L2 | 0 | -130 | Relocate the data | ... | -130 |

OFFSETS FOR EACH UNIT

FIG. 13

READ OFFSET COMPENSATION IN READ OPERATION OF MEMORY DEVICE

CROSS-REFERENCE TO RELATED APPLICATIONS

This application is a continuation of International Application No. PCT/CN2023/070613, filed on Jan. 5, 2023, entitled "READ OFFSET COMPENSATION IN READ OPERATION OF MEMORY DEVICE," which is hereby incorporated by reference in its entirety.

BACKGROUND

The present disclosure relates to memory devices and operations thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase. For NAND Flash memory, an erase operation can be performed at the block level, and a program operation or a read operation can be performed at the page level.

SUMMARY

In one aspect, a memory system includes a memory device and a memory controller. The memory device includes an array of memory cells and a peripheral circuit. Each memory cell is configured to be set to one of $2^N$ states corresponding to a piece of N-bit data, where N is an integer greater than 1, and the array of memory cells is partitioned into one or more units. The peripheral circuit is coupled to the memory cells and configured to perform a read operation on a selected memory cell of the memory cells in a unit of the units. The memory controller is coupled to the memory device and configured to control the memory device to perform the read operation using a compensated read voltage with an offset from a default read voltage by sending instructions to the peripheral circuit. The offset is correlated with a number P of memory cells in the unit that are in one or more programmed states of the $2^N$ states.

In some implementations, the offset is associated with the unit and is updated after the number P of memory cells in the unit changed.

In some implementations, the offset is updated periodically.

In some implementations, an update period is less than or equal to a minimum interval between two adjacent programming operations performed on the unit.

In some implementations, the number P is obtained through a verify reading operation configured to count the number P of memory cells in the unit.

In some implementations, the memory controller is configured to select one or more programmed states of the $2^N$ states and determine a verify voltage used in the verify reading operation based on a default range of threshold voltages corresponding to the selected one or more states. The verify voltage is equal to a minimum threshold voltage of the default range of threshold voltages corresponding to the selected one or more states.

In some implementations, a number of the selected one or more programmed states of the $2^N$ is one, and the minimum threshold voltage of the default range of threshold voltages corresponding to the selected state is higher than a threshold voltage of memory cells corresponding to unselected states of the $2^N$ states.

In some implementations, the peripheral circuit includes a word line driver configured to apply the verify voltage to at least part of the memory cells in the unit through a word line.

In some implementations, the memory controller includes a digital signal processor configured to count the number P after the verify voltage is applied to at least part of the memory cells in the unit.

In some implementations, each unit of the one or more units comprises one or more page, the verify reading operation is performed on one or more selected pages of the one or more pages, and the number P is an average number of memory cells in the one or more selected pages that are in one or more programmed states of the $2^N$ states.

In some implementations, the controller includes a processor configured to obtain the offset through a look up operation by looking up the offset corresponding to the number P and a first mapping table between the offset and the number P.

In some implementations, the memory controller includes a first register configured to store the first mapping table.

In some implementations, the memory controller includes a digital signal processor configured to calculate a number difference $\Delta P$ between the number P with a default number P'—a number of memory cells in the unit that are in the one or more programmed states of the $2^N$ states after a program operation is completed.

In some implementations, the memory controller includes a processor configured to obtain the offset through a look up operation by looking up the offset corresponding to the number difference $\Delta P$ and a second mapping table between the offset and the number difference $\Delta P$.

In some implementations, the memory controller includes a second register configured to store the second mapping table.

In some implementations, the memory controller includes a third register configured to store the default number P'.

In some implementations, the processor is configured to, for a memory cell in the unit, adjust the offset based on a default threshold voltage of the memory cell.

In some implementations, the adjusted offset of the memory cell in the unit is positively related to the default threshold voltage of the memory cell.

In some implementations, the memory controller includes a fourth register configured to store the offset obtained by the processor.

In some implementations, the processor is configured to retrieve the offset from the fourth register and calculate the compensated read voltage by adding the offset to the default read voltage.

In another aspect, a memory controller is coupled to a memory device including an array of memory cells, each memory cell is set to one of $2^N$ states corresponding to a piece of N-bits data, where N is an integer greater than 1, and the array of memory cells is partitioned into one or more units. The memory controller is coupled to the memory device and configured to, upon executing instructions: obtain, from the memory device, a number P of memory cells in a unit of the units that are in one or more programmed states of the $2^N$ states; calculate, based on the number P, a compensated read voltage with an offset from a default read voltage; and provide, to the memory device, the compensated read voltage for a read operation performed on a selected memory cell of the memory cells in a unit of the units.

In some implementations, the offset is associated with the unit and is updated after the number P of memory cells in the unit changed.

In some implementations, the offset is updated periodically. In some implementations, an update period is less than or equal to a minimum interval between two adjacent programming operations performed on the unit.

In some implementations, the memory controller includes a processor configured to control the memory device to count the number P of memory cells in the unit by running a verify reading operation.

In some implementations, the processor is configured to select one or more programmed states of the $2^N$ states; and determine a verify voltage used in the verify reading operation based on a default range of threshold voltages corresponding to the selected one or more states; and the verify voltage is equal to a minimum threshold voltage of the default range of threshold voltages corresponding to the selected one or more states.

In some implementations, a number of the selected one or more programmed states of the $2^N$ is one, and the minimum threshold voltage of the default range of threshold voltages corresponding to the selected state is higher than a threshold voltage of memory cells corresponding to unselected states of the $2^N$ states.

In some implementations, the memory controller includes a digital signal processor configured to count the number P after the verify voltage is applied to at least part of the memory cells in the unit.

In some implementations, each unit of the one or more units comprises one or more page, the verify reading operation is performed on one or more selected pages of the one or more pages, and the number P is an average number of memory cells in the one or more selected pages that are in one or more programmed states of the $2^N$ states.

In some implementations, includes a processor configured to obtain the offset through a look up operation by looking up the offset corresponding to the number P and a first mapping table between the offset and the number P.

In some implementations, the memory controller includes a first register configured to store the first mapping table.

In some implementations, the memory controller includes a digital signal processor configured to calculate a number difference ΔP between the number P with a default number P'—a number of memory cells in the unit that are in the one or more programmed states of the $2^N$ states after a program operation is completed.

In some implementations, the memory controller includes a processor configured to obtain the offset through a look up operation by looking up the offset corresponding to the number difference ΔP and a second mapping table between the offset and the number difference ΔP.

In some implementations, the memory controller includes a second register configured to store the second mapping table.

In some implementations, the memory controller includes a third register configured to store the default number P'.

In some implementations, the processor is configured to, for a memory cell in the unit, adjust the offset based on a default threshold voltage of the memory cell.

In some implementations, the adjusted offset of the memory cell in the unit is positively related to the default threshold voltage of the memory cell.

In some implementations, the memory controller includes a fourth register configured to store the offset obtained by the processor.

In some implementations, the processor is configured to retrieve the offset from the fourth register and calculate the compensated read voltage by adding the offset to the default read voltage.

In yet another aspect, a memory device includes an array of memory cells and a peripheral circuit. Each memory cell being configured to be set to one of $2^N$ states corresponding to a piece of N-bit data, where N is an integer greater than 1, and the array of memory cells is partitioned into one or more units. The peripheral circuit coupled to the memory cells and configured to perform a read operation on a selected memory cell of the memory cells in a unit of the units using a compensated read voltage with an offset from a default read voltage. The offset is correlated with a number P of memory cells in the unit that are in one or more programmed states of the $2^N$ states.

In some implementations, the offset is associated with the unit and is updated after the number P of memory cells in the unit changed.

In some implementations, the offset is updated periodically.

In some implementations, an update period is less than or equal to a minimum interval between two adjacent programming operations performed on the unit.

In some implementations, the number P is obtained through a verify reading operation configured to count the number P of memory cells in the unit.

In some implementations, the peripheral circuit is configured to select one or more programmed states of the $2^N$ states; and determine a verify voltage used in the verify reading operation based on a default range of threshold voltages corresponding to the selected one or more states. The verify voltage is equal to a minimum threshold voltage of the default range of threshold voltages corresponding to the selected one or more states.

In some implementations, a number of the selected one or more programmed states of the $2^N$ is one, and the minimum threshold voltage of the default range of threshold voltages corresponding to the selected state is higher than a threshold voltage of memory cells corresponding to unselected states of the $2^N$ states.

In some implementations, the peripheral circuit includes a word line driver configured to apply the verify voltage to at least part of the memory cells in the unit through a word line.

In some implementations, the peripheral circuit includes a calculator configured to calculate the number P after the verify voltage is applied to at least part of the memory cells in the unit.

In some implementations, each unit of the one or more units comprises one or more page, the verify reading operation is performed on one or more selected pages of the one or more pages, and the number P is an average number of memory cells in the one or more selected pages that are in one or more programmed states of the $2^N$ states.

In some implementations, the peripheral circuit includes a control logic configured to obtain the offset through a look up operation by looking up the offset corresponding to the number P and a first mapping table between the offset and the number P.

In some implementations, the peripheral circuit includes a first register configured to store the first mapping table.

In some implementations, the peripheral circuit includes a calculator configured to calculate a number difference ΔP between the number P with a default number P'—a number of memory cells in the unit that are in the one or more programmed states of the $2^N$ states after a program operation is completed.

In some implementations, the control logic is configured to obtain the offset through a look up operation by looking up the offset corresponding to the number difference $\Delta P$ and a second mapping table between the offset and the number difference $\Delta P$.

In some implementations, the peripheral circuit includes a second register configured to store the second mapping table.

In some implementations, the peripheral circuit includes a third register configured to store the default number P'.

In some implementations, the processor is configured to, for a memory cell in the unit, adjust the offset based on a default threshold voltage of the memory cell.

In some implementations, the adjusted offset of the memory cell in the unit is positively related to the default threshold voltage of the memory cell.

In some implementations, the peripheral circuit includes a fourth register configured to store the offset obtained by the processor.

In some implementations, the control logic is configured to retrieve the offset from the fourth register and calculate the compensated read voltage by adding the offset to the default read voltage.

In still another aspect, a method for reading a memory device including an array of memory cells being configured to be set to one of $2^N$ states corresponding to a piece of N-bit data, where N is an integer greater than 1, and the array of memory cells is partitioned into one or more units, the method including: obtaining a number P of memory cells in a unit that are in one or more programmed states of the $2^N$ states; calculating a compensated read voltage with an offset from a default read voltage; and performing a read operation with the compensated read voltage on a selected memory cell of the memory cells in the unit.

In some implementations, after calculating the compensated read voltage, the method further includes updating the offset after the number P of memory cells in the unit changed. In some implementations, the offset is updated periodically.

In some implementations, an update period is less than or equal to a minimum interval between two adjacent programming operations performed on the unit.

In some implementations, the number P of memory cells in a unit is calculated by running a verify reading operation.

In some implementations, running a verify reading operation includes: selecting one or more programmed states of the $2^N$ states; and determining a verify voltage used in the verify reading operation based on a default range of threshold voltages corresponding to the selected one or more states. The verify voltage is equal to a minimum threshold voltage of the default range of threshold voltages corresponding to the selected one or more states.

In some implementations, a number of the selected one or more programmed states of the $2^N$ is one, and the minimum threshold voltage of the default range of threshold voltages corresponding to the selected state is higher than a threshold voltage of memory cells corresponding to unselected states of the $2^N$ states.

In some implementations, each unit of the one or more units comprises one or more page, the verify reading operation is performed on one or more selected pages of the one or more pages, and the number P is an average number of memory cells in the one or more selected pages that are in one or more programmed states of the $2^N$ states.

In some implementations, calculating the compensated read voltage with the offset includes looking up the offset corresponding to the number P and a first mapping table between the offset and the number P.

In some implementations, the first mapping table is stored in a first register.

In some implementations, calculating the compensated read voltage with the offset includes calculating a number difference $\Delta P$ between the number P with a default number P'—a number of memory cells in the unit that are in the one or more programmed states of the $2^N$ states after a program operation is completed.

In some implementations, calculating the compensated read voltage with the offset further includes looking up the offset corresponding to the number difference $\Delta P$ and a second mapping table between the offset and the number difference $\Delta P$.

In some implementations, the second mapping table is stored in a second register.

In some implementations, the default number P' is stored in a third register.

In some implementations, after calculating the compensated read voltage with the offset, the method further includes adjusting the offset based on a default threshold voltage of the memory cell.

In some implementations, the adjusted offset of the memory cell in the unit is positively related to the default threshold voltage of the memory cell.

In some implementations, storing the adjusted offset into a fourth register.

In some implementations, determining the compensated read voltage includes: retrieving the offset from the fourth register; and calculating the compensated read voltage by adding the offset to the default read voltage.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

FIG. 10A illustrates a diagram of relationship between a verify voltage and threshold voltage distributions without charge loss.

FIG. 10B illustrates a diagram of relationship between a verify voltage and threshold voltage distributions with charge loss.

FIG. 11 illustrates a diagram of first mapping table.

FIG. 13 illustrates a diagram of a table of offsets for each unit.

Aspects of the present disclosure will be described with reference to the accompanying drawings.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Figure 1:
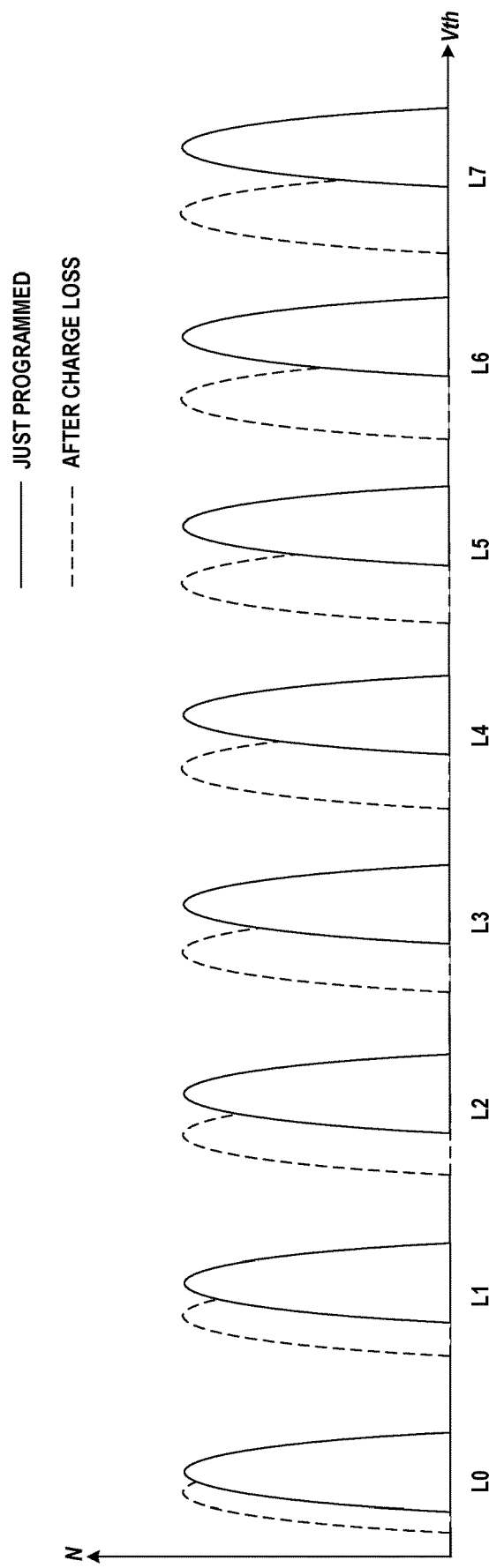
FIG. 1 illustrates a diagram of change trend of threshold voltage distributions of a memory device after charge loss, according to some aspects of the present disclosure.
Figure 2A:
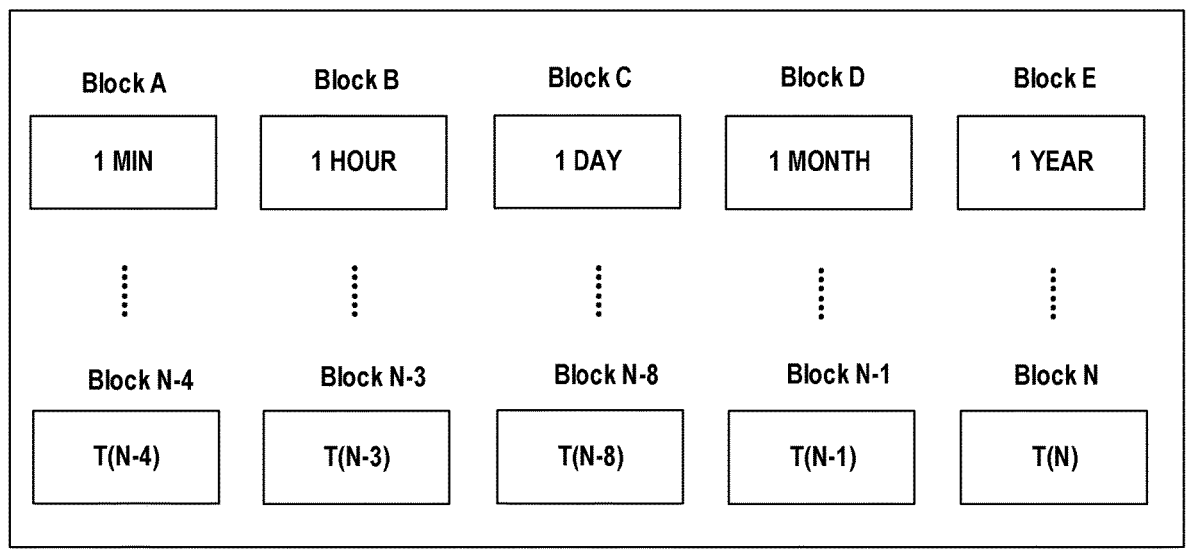
FIG. 2A illustrates a diagram of storage time of blocks in a memory device, according to some aspects of the present disclosure.
Figure 2B:
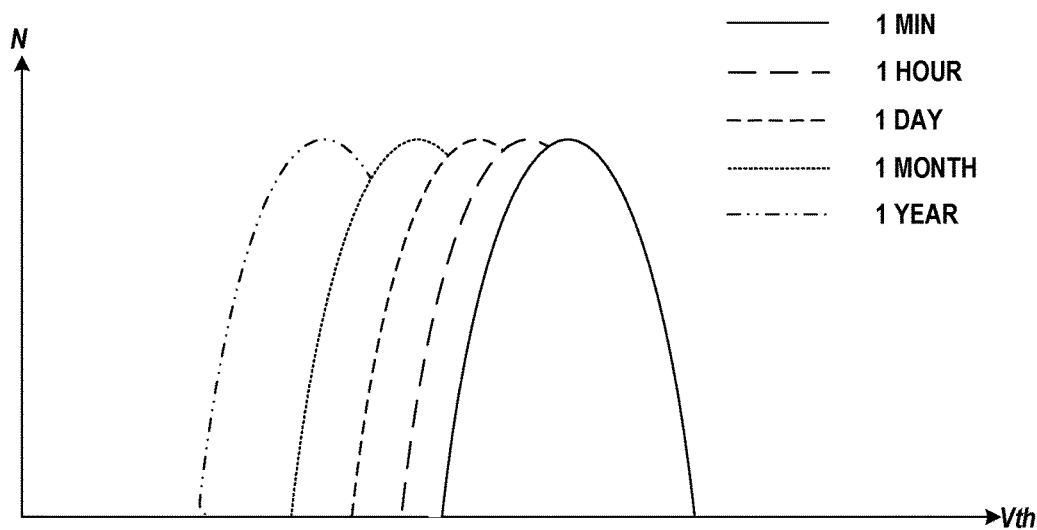
FIG. 2B illustrates a diagram of relationship between storage time and threshold voltage distributions of a memory device, according to some aspects of the present disclosure.

Memory devices, such as NAND Flash memory devices, can store more than a single bit of information into each memory cell with multiple states to increase the storage capacity and reduce the cost per bit by utilizing charge trap technology. In program operations of a memory device employing charge trap technology, the data is able to be programmed (written) into multi-level cell (MLC) blocks, such as trip-level cell (TLC) blocks, quad-level cell (QLC) blocks, penta-level cell (PLC) etc., thereby the programming speed is significantly increased. Referring to FIG. 1, the threshold voltage distributions of blocks will be decreased due to charge loss, and memory cells in different programmed states suffer from different degrees of charge loss. The decreases of threshold voltage distributions will lead to error bits and trigger read error recovery when the charge loss is serious. A read offset is provided to compensate for the charge loss. For example, a first offset will be added to the default read voltage to compensate for the changes of threshold voltage distributions. This approach has little effect because charge loss is closely related to the duration after the data is written. The durations in different blocks do not stay statistic but change dynamically, as illustrated in FIGS. 2A and 2B. Thus, the read offset is not able to compensate for the charge loss for all the blocks and read errors cannot be avoided.

Figure 3A:
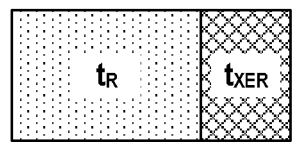
FIG. 3A illustrates a diagram of length of time caused by a read operation without error recovery.
Figure 3B:
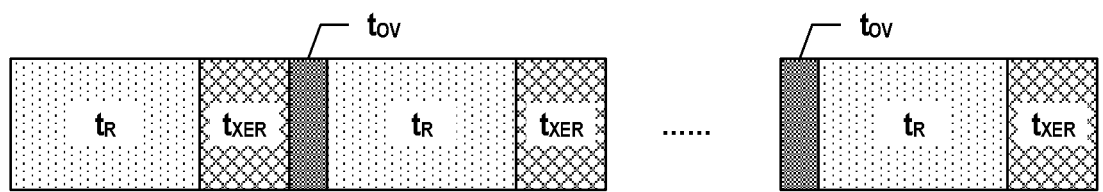
FIG. 3B illustrates a diagram of length of time caused by a read operation with error recovery.

FIG. 3A illustrates a diagram of length of time caused by a normal read operation, which includes a first duration $t_R$ for reading data from a memory page and a second duration $t_{XER}$ for transferring data to a memory controller. FIG. 3B illustrates a diagram of length of time caused by a read operation with error recovery, which further includes a third duration $t_{OV}$, in addition to the first duration $t_R$ and the second duration $t_{XER}$, for the memory controller and a hardware to get prepared to try one more time after a read error. The actual time caused by a read operation on a memory block with charge loss may be multiple of the sum of the first duration $t_R$, the second duration $t_{XER}$, and the third duration $t_{OV}$. The efficiency of the memory system is thus decreased significantly.

Figure 3C:
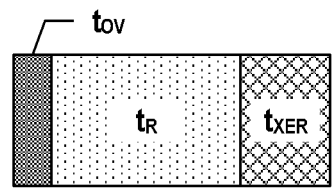
FIG. 3C illustrates a diagram of length of time caused by a read operation, according to some aspects of the present disclosure.

To address one or more aforementioned issues, the present disclosure introduces a solution in which the degree of charge loss in each block is detected, and a tailor-made read offset is generated to compensate the default read voltage based on the degree of charge loss, thus read errors are avoid, and the read speed is increased significantly, as shown in FIG. 3C, the time caused by a read operation on a memory block is the sum of the first duration $t_R$, the second duration $t_{XER}$, and the third duration $t_{OV}$ regardless of charge loss. In each block, the degree of charge loss can be detected by counting the number of memory cells that are in the programmed state, because the number will be decreased due to charge loss. The read voltage can be compensated accurately by a tailor-made offset according to the detected degree of charge loss. This solution can detect the charge loss in each block regardless of the causation of the charge loss, i.e., no matter whether the charge loss is caused by time, temperature, program operations, etc., and can compensate the read voltage accurately. The relationship between the offset and the number of the memory cells that are in the programmed state is pre-calculated and stored as a mapping table, so that the offset can be determined quickly after the number is obtained. The offset is updated periodically, not calculated before every read operation, to balance the efficiency and accuracy of read operation because the charge loss requires a certain amount of time to accumulate. The solution of the present disclosure decreases the undesirable effects of charge loss at a small cost and improves the performance of the memory device and memory system significantly.

Figure 4:
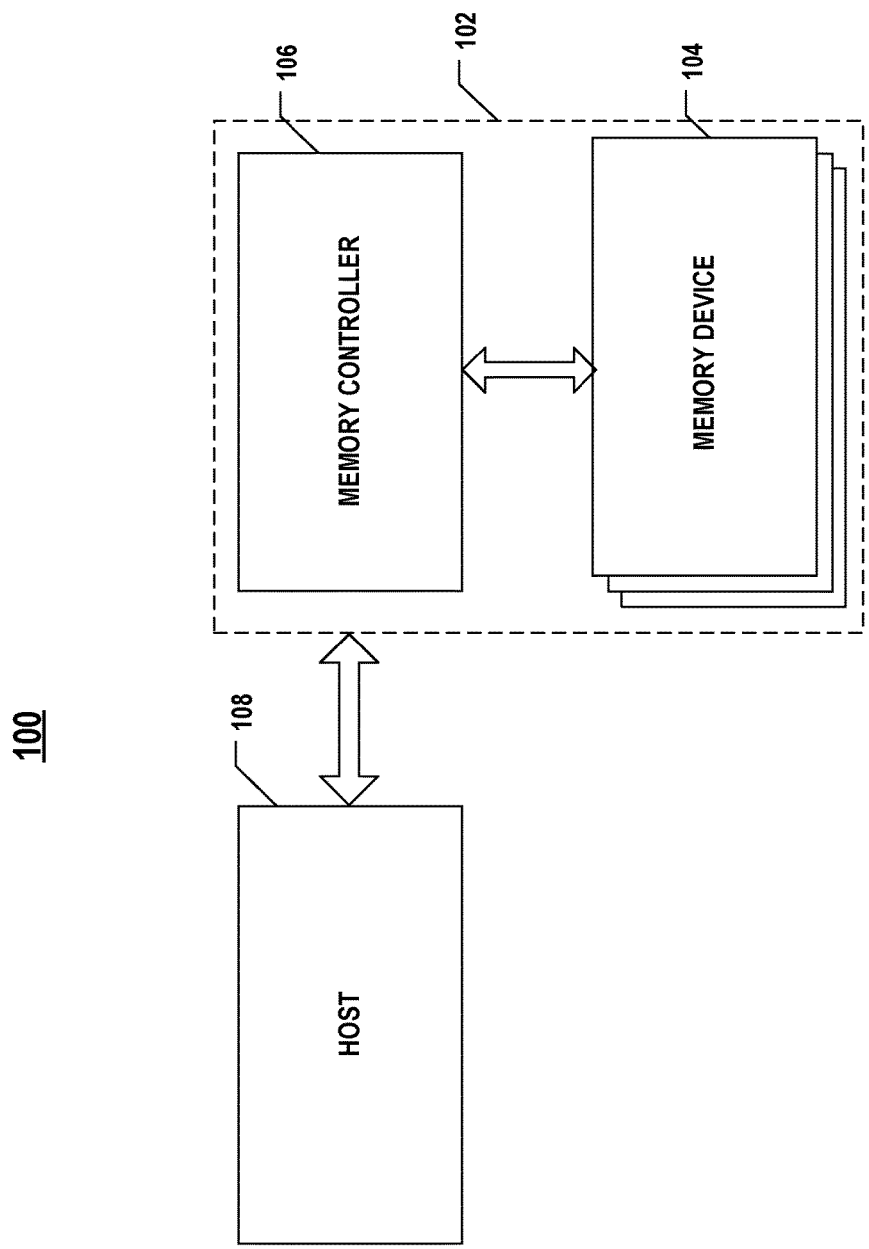
FIG. 4 illustrates a block diagram of a system having a memory device, according to some aspects of the present disclosure.

FIG. 4 illustrates a block diagram of a system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 4, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104.

Memory device 104 can be any memory device disclosed in detail in the present disclosure. Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Consistent with some aspects of the present disclosure, in some implementations, memory controller 106 is configured to fully or partially perform the read offset compensation, as described below in detail.

Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 5A:
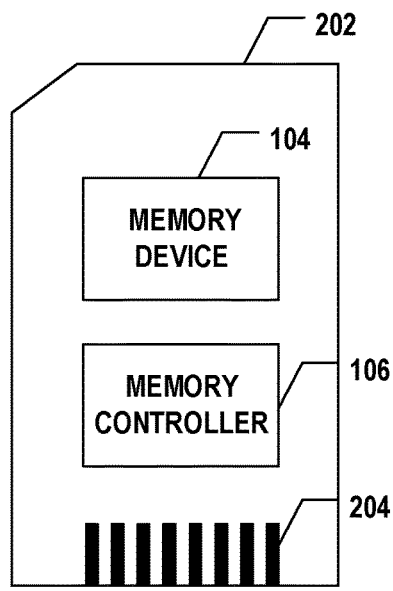
FIG. 5A illustrates a diagram of a memory card having a memory device, according to some aspects of the present disclosure.
Figure 5B:
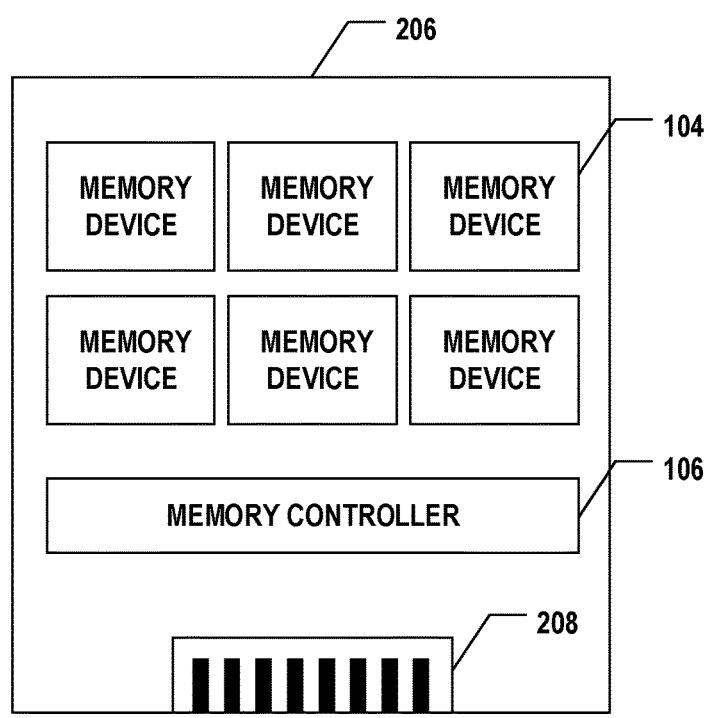
FIG. 5B illustrates a diagram of a solid-state drive (SSD) having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 5A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 5B, memory controller 106 and multiple memory devices 104 may be integrated into an SSD 206. SSD 206 can further include an SSD connector 208 coupling SSD 206 with a host (e.g., host 108 in FIG. 4). In some implementations, the storage capacity and/or the operation speed of SSD 206 is greater than those of memory card 202.

Figure 6:
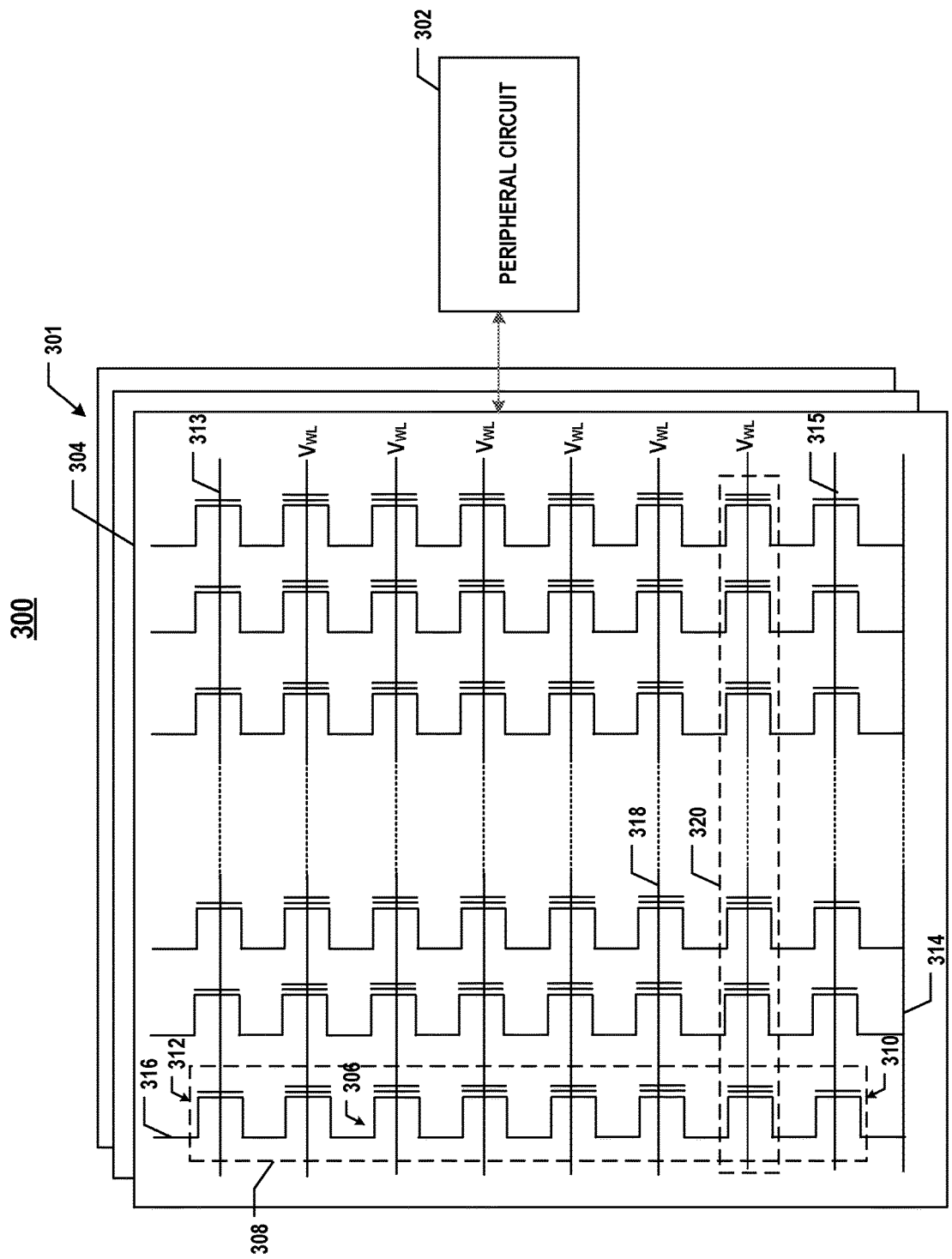
FIG. 6 illustrates a schematic diagram of a memory device including peripheral circuits, according to some aspects of the present disclosure.

FIG. 6 illustrates a schematic circuit diagram of a memory device 300 including peripheral circuits, according to some aspects of the present disclosure. Memory device 300 can be an example of memory device 104 in FIG. 4. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 6 each NAND memory string 308 can include a source select gate (SSG) 310 at its source end and a drain select gate (DSG) 312 at its drain end. SSG 310 and DSG 312 can be configured to activate selected NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (ACS), according to some implementations. DSG 312 of each NAND memory string 308 is coupled to a respective bit line 316 from which data can be read or written via an output bus (not shown), according to some implementations. In some implementations, each NAND memory string 308 is configured to be selected or deselected by applying a select voltage (e.g., above the threshold voltage of the transistor having DSG 312) or a deselect voltage (e.g., 0 V) to respective DSG 312 through one or more DSG lines 313 and/or by applying a select voltage (e.g., above the threshold voltage of the transistor having SSG 310) or a deselect voltage (e.g., 0 V) to respective SSG 310 through one or more SSG lines 315.

As shown in FIG. 6, NAND memory strings 308 can be organized into multiple blocks 304, each of which can have a common source line 314, e.g., coupled to the ACS. In some implementations, each block 304 is the basic data unit for erase operations, i.e., all memory cells 306 on the same block 304 are erased at the same time. To erase memory cells 306 in a selected block 304, source lines 315 coupled to selected block 304 as well as unselected blocks 304 in the same plane as selected block 304 can be biased with an erase voltage (Vers), such as a high positive voltage (e.g., 20 V or more). It is understood that in some examples, erase operation may be performed at a half-block level, a quarter-block level, or a level having any suitable number of blocks or any suitable fractions of a block. Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program operations. The size of one page 320 in bits can relate to the number of NAND memory strings 308 coupled by word line 318 in one block 304. For ease of description, memory cells 306 in one page 320 may be coupled to a same word line 318, and the terms "page" and "word line" may be used interchangeably in the present disclosure. It is understood that, however, in some examples, memory cells 306 in one page 320 may be coupled to more than one word line 318. Each word line 318 can include a plurality of control gates (gate electrodes) at each memory cell 306 in respective page 320 and a gate line coupling the control gates.

Figure 7:
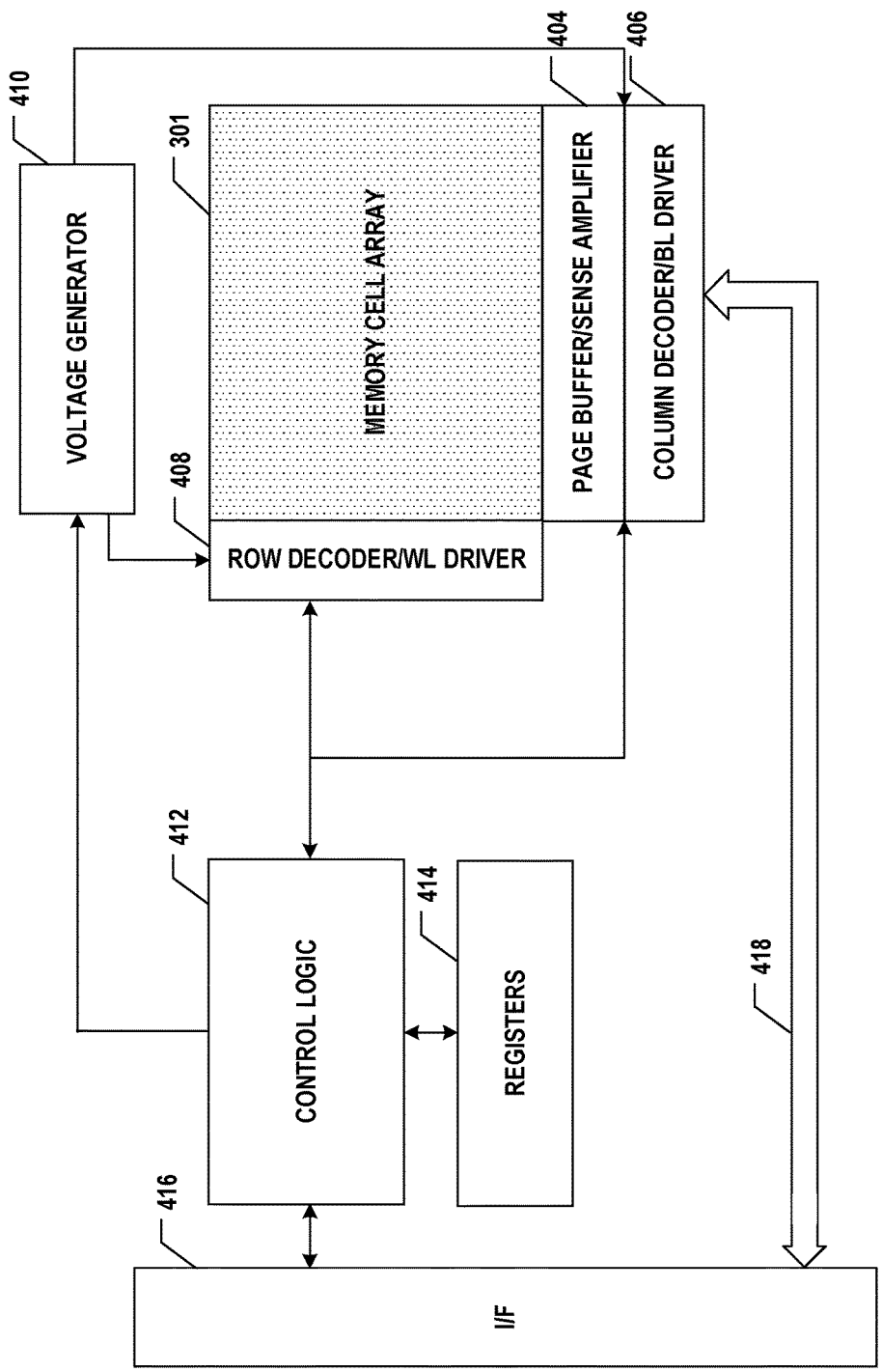
FIG. 7 illustrates a block diagram of a memory device including a memory cell array and peripheral circuits, according to some aspects of the present disclosure.

As shown in FIG. 6, consistent with the scope of the present disclosure, since a program operation is performed at the page/word line level for each block 304. Peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 7 illustrates peripheral circuits in the memory device 104, the peripheral circuits including a page buffer/sense amplifier 404, a column decoder/bit line driver 406, a row decoder/word line driver 408, a voltage generator 410, control logic 412, registers 414, an interface 416, and a data bus 418. It is understood that in some examples, additional peripheral circuits not shown in FIG. 7 may be included as well.

Page buffer/sense amplifier 404 can be configured to read and program (write) data from and to memory cell array 301 according to the control signals from control logic 412. In one example, page buffer/sense amplifier 404 may store one page of program data (write data) to be programmed into one page 320 of memory cell array 301. In another example, page buffer/sense amplifier 404 may perform program verify operations to ensure that the data has been properly programmed into memory cells 306 coupled to selected word lines 318. In still another example, page buffer/sense amplifier 404 may also sense the low power signals from bit line 316 that represents a data bit stored in memory cell 306 and amplify the small voltage swing to recognizable logic levels in a read operation. Column decoder/bit line driver 406 can be configured to be controlled by control logic 412 and select one or more NAND memory strings 308 by applying bit line voltages generated from voltage generator 410.

Row decoder/word line driver 408 can be configured to be controlled by control logic 412 and select/deselect blocks 304 of memory cell array 301 and select/deselect word lines 318 of block 304. Row decoder/word line driver 408 can be further configured to drive word lines 318 using word line voltages generated from voltage generator 410. In some implementations, row decoder/word line driver 408 can also select/deselect and drive SSG lines 315 and DSG lines 313 as well. As described below in detail, row decoder/word line driver 408 is configured to apply a read voltage to selected word line 318 in a read operation on memory cell 306 coupled to selected word line 318.

Voltage generator 410 can be configured to be controlled by control logic 412 and generate the word line voltages (e.g., read voltage, program voltage, pass voltage, local voltage, verification voltage, etc.), bit line voltages, and source line voltages to be supplied to memory cell array 301. Control logic 412 can be coupled to each peripheral circuit described above and configured to control operations of each peripheral circuit. Registers 415 can be coupled to control logic 412 and include status registers, command registers, and address registers for storing status information, command operation codes (OP codes), and command addresses for controlling the operations of each peripheral circuit.

Interface 416 can be coupled to control logic 412 and act as a control buffer to buffer and relay control commands received from a host (not shown) to control logic 412 and status information received from control logic 412 to the host. Interface 416 can also be coupled to column decoder/bit line driver 406 via data bus 418 and act as a data input/output (I/O) interface and a data buffer to buffer and relay the data to and from memory cell array 301.

Figure 8:
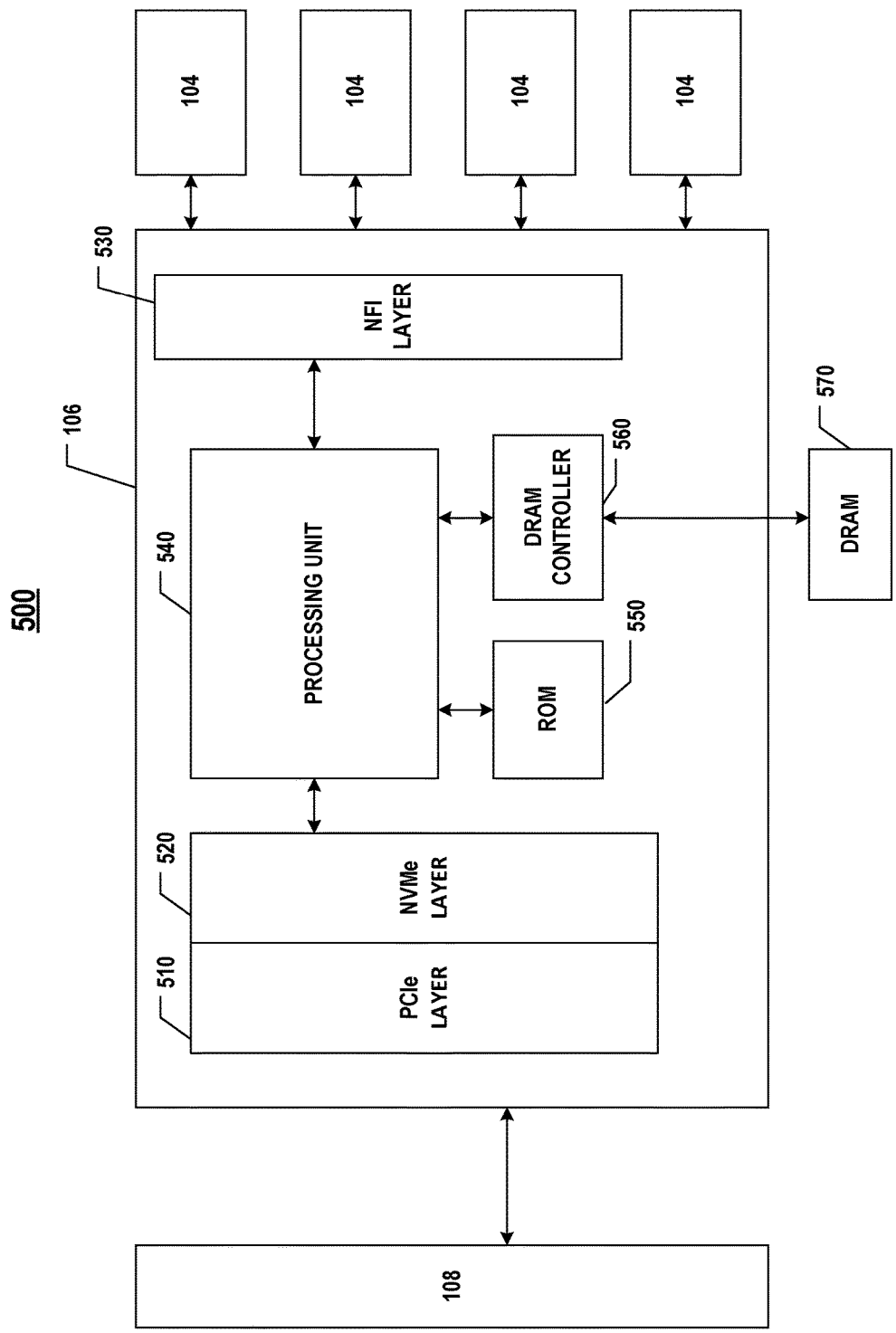
FIG. 8 illustrates a block diagram of a memory system including a host, a memory controller and memory devices, according to some aspects of the present disclosure.

Referring to FIG. 8, a memory system 500 including a plurality of memory devices 104 and a memory controller 106 is provided according to some implementations of the present disclosure. Each of the memory device 104 includes an array of memory cells and a peripheral circuit as shown in FIG. 7. The memory cells in memory device 104 are MLC, and each memory cell is configured to be set to one of $2^N$ states corresponding to a piece of N-bit data, where N is an integer greater than 1. The array of memory cells is partitioned into one or more units. The units can be physical units or logical units. For example, a unit can be a page or a block based on the physical connection between memory cells; a unit can also be a group of memory cells in different pages or blocks which are operated in the same write operation. The number of the memory cells in each unit can be same or different depending on the practical needs of storage. In one implementation, the number of memory cells in a unit can be one. The way in which the units are divided and the number of memory cells in the units described herein are for illustrative purposes only and should not be interpreted as a limitation of the present disclosure. The peripheral circuit is coupled to the memory cells and configured to perform a read operation on a selected memory cell of the memory cells in a unit of the units.

Memory controller 106 may be coupled to a memory device and be configured to perform the various interface protocols disclosed herein. As shown in FIG. 8, memory controller 106 is coupled to one or more Memory device 104 and configured to control the cache programming of memory device 104. Memory controller 106 may include various interface layers, including but not limited to, a peripheral component interconnect express (PCIe) layer 510, a non-volatile memory express (NVMe) layer 520, and/or a NAND controller interface (NFI) layer 530 to interface with host 108 and Memory device 104. PCIe layer 510 and/or an NVMe layer 520 may be coupled to one or more processing unit(s) 540 (e.g., microcontroller(s)), which may be configured to implement various memory control functionalities through executing instructions in the form of, for example, firmware, stored in read-only memory (ROM) 550. Processing unit(s) 540 may be coupled to a dynamic random-access memory (DRAM) 570 through a DRAM controller 560. DRAM controller 560 may be configured to store and access data stored on DRAM 570, such as the cached new programming data and/or the reconstructed current programming data sent from memory device 104 to memory controller 106 according to the various interface protocols disclosed herein. It is understood that in some examples, DRAM 570 and DRAM controller 560 may be omitted. In other words, memory controller 106 can be a non-DRAM memory controller.

Figure 9A:
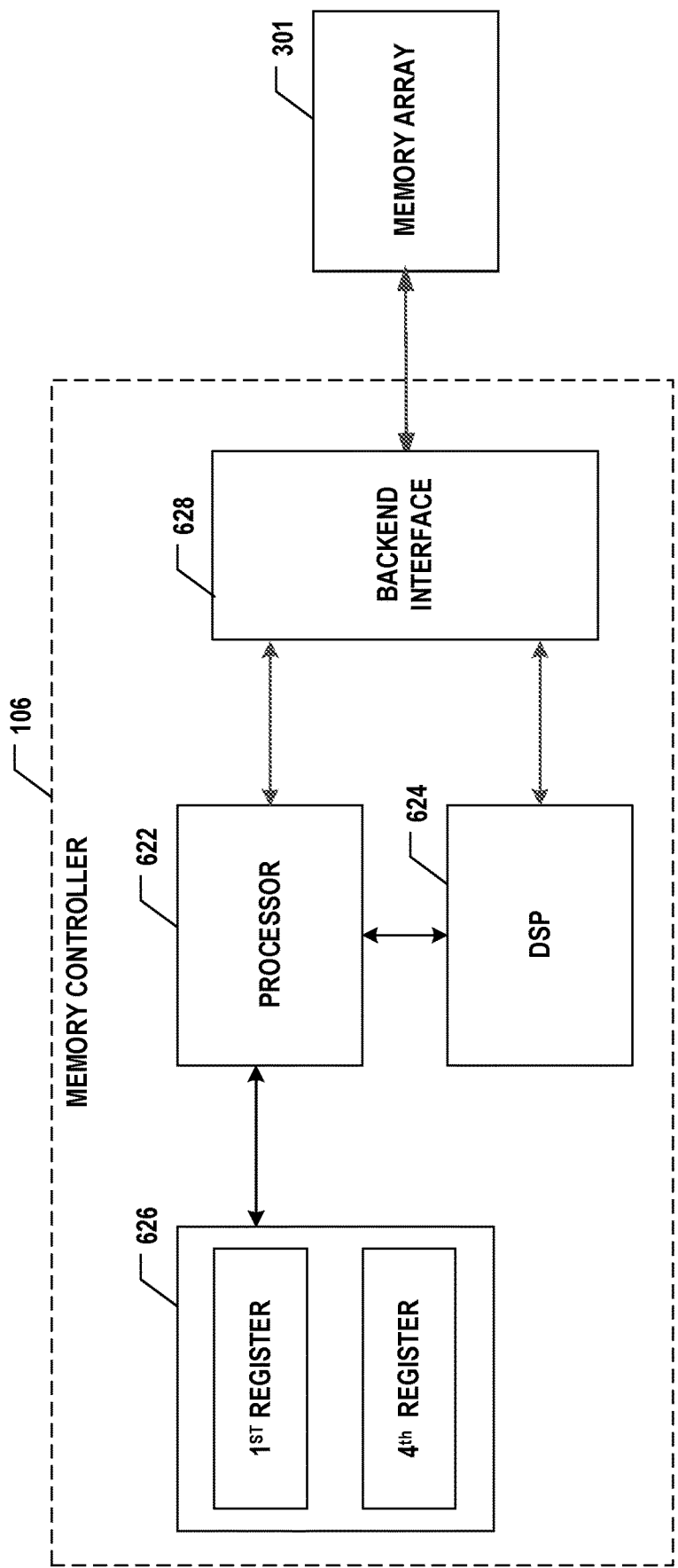
FIG. 9A illustrates a block diagram of a memory controller coupled to a memory cell array, according to some aspects of the present disclosure.

FIG. 9A illustrates an implementation of memory controller 106 coupled to memory cell array 301 through a backend interface 628. Memory controller 106 includes a processor 622 and a digital signal processor (DSP) 624 coupled to backend interface 628. Processor 622 is configured to control memory cell array 301 to count the number P of memory cells in the unit by running a verify reading operation. DSP 624 is configured to count the number P after the verify voltage is applied to at least part of the memory cells in the unit. Memory controller 106 further includes a register 626 configured to store a first mapping table and the offset. The number P counted by DSP 624 can be stored in a register, for example, register 626, processor 622 can extracted the number P from the register. The first mapping table, the number P, and the offset can be stored in the same register or different registers depending on the size of the register. In the present implementation, the first mapping table is stored in a first register, and the offset is stored in a fourth register.

In one implementation of the present disclosure, memory controller 106 is configured to control memory device 104 to perform the read operation using a compensated read voltage with an offset from a default read voltage by sending instructions to the peripheral circuit. The offset is correlated with a number P of memory cells in the unit that are in one or more programmed states of the $2^N$ states. TLC units are employed as an example in the present implementation, (N=3), and there are eight states in each TLC unit. Other MLC units, such as QLC units and PLC units can be used in the present disclosure as well. In QLC units, N=4, there are 16 states in memory cells in QLC units and 15 of the 16 states are programmed states. In PLC units, N=5, there are 32 states in memory cells in QLC units and 31 of the 32 states are programmed states. The present disclosure can be applied to any MLC units regardless of how many states the units have.

Referring to FIG. 10A, the number of memory cells in each state of the eight states is roughly the same after data is programmed into the memory device. Default read voltages for memory cells in different states are set in the margins between adjacent states. Taking state L7 as an example, a default read voltage of memory cells in state L7 is lower than or equal to a minimum threshold voltage of memory cells in state L7 and larger than a maximum threshold voltage of memory cells in state L6. FIG. 10B shows the threshold voltage distributions in the same unit after a period of time in the memory device. Although the number of memory cells in each state of the eight states changes slightly when the threshold voltage decreases, the default read voltage of read operation remains at the original level. In a situation where the default read voltage equals the minimum threshold voltage of memory cells in state L7, the read operation will be completed with the distributions shown in FIG. 10A and failed with the distribution shown in FIG. 10B. When a read operation is failed, referring to FIG. 3B, error recovery will be triggered to adjust the read voltage. This process can be time-consuming because the degree of the threshold voltage decrease for each unit is different. The larger the threshold voltage deviating from the default read voltage, the longer the error recovery will cost. A fixed offset cannot solve this question.

To save the time spent on error recovery, the charge loss for each memory unit should be compensated accurately, i.e., the offset should be tailor-made for each unit based on the period for each read operation after the unit is programmed. The offset is updated periodically to compensate for the charge loss accurately, as the charge loss will be accumulated and change over time. Charge loss is relatively slow compared to the speed and frequency of read operations; for example, the threshold voltage of a memory cell will not be affected util the lost charge accumulated to a certain degree, which might cost a month or a longer time. Thus, there is no need to update the offset for every read operation. In the present implementation, the offset can be updated periodically after a program operation. In some implementations, an update period is less than or equal to a minimum interval between two adjacent programming operations performed on the unit. For example, the offset is updated every month after a write operation.

The number P of memory cells in the unit is obtained through a verify reading operation employing a verify voltage. To determine the verify voltage, one or more programmed states of the $2^N$ states are selected, then a default range of threshold voltages corresponding to the selected one or more states are extracted. The verify voltage should be equal to a minimum threshold voltage of the default range of threshold voltages corresponding to the selected one or more states, so that any minor charge loss can be detected.

In the present implementation, the number of the selected one or more programmed states of the $2^N$ is one, i.e., the minimum threshold voltage of the default range of threshold voltages corresponding to the selected state is higher than a threshold voltage of memory cells corresponding to unselected states of the $2^N$ states. Referring to FIG. 10A and FIG. 10B, eight states can be stored in a TLC unit in which L0 is an erased state and L1 to L7 are seven programmed states. The highest level, L7, is selected, and the corresponding L7 verify voltage equals the minimum threshold voltage of L7. In the verify reading operation, the verify voltage is applied to at least part of the memory cells in the unit through word line 318 driven by the word line driver 408. In other MLC units, such as QLC units, sixteen states can be stored in a QLC unit in which L0 is an erased state and L1 to L15 are fifteen programmed states. The highest level, L15, can be selected, and the corresponding L15 verify voltage equals the minimum threshold voltage of L15.

The principle of the verify reading operation is to view an MLC unit as a single level cell (SLC) unit, i.e., a memory cell with a threshold voltage higher than a verify voltage will be in a first state and feedback a data "0", a memory cell with a threshold voltage lower than the verify voltage will be in a second state and feedback a data "1". Assuming an ideal situation in which no charge loss in the memory device, the number of the memory cell in the first state should remain unchanged over time. However, in practice, with the charge in the memory cell being de-trapped, the threshold voltage distributions shift left as shown in FIG. 1. Thus, when the verify reading operation is performed on the memory device, the number of the memory cells in the first state will decrease. The more the charge is lost, the smaller the number of the memory cells in the first state will be. In this way, the degree of charge loss is detected accurately, and an offset can be tailor-made to compensate for the charge loss accurately. The first state and second state are distinguished by the verify voltage of the verify reading operation. One or more programmed states of the $2^N$ states can be selected by the setting of the verify voltage. Usually, the memory cells at the highest level will be selected to improve the speed and accuracy of the verify reading operation, for example, level 7 for a TLC device and level 15 for a QLC device. Once the verify voltage is determined, it will be fixed and will not change for the following verify reading operations.

When the L7 verify voltage is applied to the unit after the program operation is just finished, the number P of the memory cells in the state L7 equals to a default number P'. Since there is a scrambler to randomize the data pattern in each program operation, the number of the memory cells in each state of the eight states is close. For example, in an 18 KB NAND page, there are 18×1024×8=147456 bits in total, and the number of the memory cells in each state of the eight states is 147456/8=18432 bits. For a unit including 1 page, the number of the memory cells in each state of the eight states is 18432×1=18432 bits. For a unit including 4 pages, the number of the memory cells in each state of the eight states is 18432×4=73728 bits. For a unit including 8 pages, the number of the memory cells in each state of the eight states is 18432×8=147456 bits. In the present implementation, taking a unit including 4 pages as an example, after the unit is just programmed, the number P of the memory cells in the state L7 equals a default number P' of the memory cells in the state L7, which is 73728 bits.

As time goes on, more and more electrons de-trapped on the cells because of charge loss. Therefore, the threshold voltage distributions shift down, i.e., L7 shifts left, and the number cell number P decreases. After the L7 verify voltage is applied to at least part of the memory cells in the unit, the number P is counted by a digital signal processor of the memory controller. As shown in FIG. 10B, as the threshold voltage distributions shift left, the number P of the memory cells in L7 is less than the default number P' under the same verify voltage. To address the offset to compensate for the charge loss, processor 622 sends instructions to memory cell array 301 through backend interface 628 to control memory cell array 301 to count the number P of memory cells in L7 state by running the verify reading operation. The verify voltage used in the verify reading operation is confirmed by processor 622 as described above, i.e., the minimum threshold voltage of the memory cells in L7 state.

After the verify reading operation is completed, DSP 624 counts the number P. In an implementation, DSP 624 coupled to a page buffer of memory cell array 301 through backend interface 628. For memory cells coupled to the same bit line, the number of the memory cells and the current generated by each memory cell in L7 state is stored in register 626, the total current generated under verify voltage can be tested by the page buffer, the number of the memory cells in L7 is proportional to the current tested by the page buffer.

In some implementations, each unit of the one or more units includes one or more pages, the verify reading operation is performed on one or more selected pages of the one or more pages, and the number P is an average number of memory cells in the one or more selected pages that are in one or more programmed states of the $2^N$ states. The verify reading operation is performed page by page, i.e., memory cells driven by a same bit line will be verified in a same verify reading operation. For a unit includes a plurality of pages, sampling part, not all, of the pages can improve verify efficiency. For example, unit 1 includes 1024 pages which are written through a same write operation, running the verify reading operation on all the 1024 pages is time-consuming. As charge loss is strongly related to the period after the last write operation, pages in the same unit have a similar degree of charge loss. Thus, it is reasonable to sample few pages of the 1024 pages to obtain the number P. For example, selected one page to run the verify reading operation. In other implementation, two or more pages can be selected to run the verify reading operation, and the number P can be obtained by averaging the number of memory cells in the selected pages that are in the selected state to reduce errors.

After the number P is confirmed, processor 622 is able to obtain the offset through a look up operation by looking up the offset corresponding to the number P in a first mapping table between the offset and the number P. The first mapping table can be stored in the first register of register 626. The first mapping table can also be stored in a static random-access memory (SRAM). FIG. 11 illustrates an example of the first mapping table, where M corresponds with the number P. Which means, M is the number of memory cells in the unit when P is the number of memory cells in the unit that are in one or more programmed states of the $2^N$ states, and M is the number of memory cells in a selected page of the unit when P is the number of memory cells in the selected page that are in one or more programmed states of the $2^N$ states. In the present implementation, only part, but not all, of the pages in the unit is selected to run the verify reading operation, M is the number of memory cells in the selected page of the unit that is in one or more programmed states of the $2^N$ states. In another implementation, all pages in the unit are selected to run the verify reading operation, then M is the number of memory cells in the unit that are in one or more programmed states of the $2^N$ states. In the present implementation, M is the number of memory cells in the selected page that is in L7 state after the selected page is just programmed, i.e., 18432. The degree of charge loss is divided into eight levels, ranging from D0 to D7, based on the number P counted by DSP 624. As shown in FIG. 11, if the number P is 18340, which is smaller than M and larger than $$\frac{15}{16}M,$$

the degree of the charge loss corresponding to 18340 is D0, which is slight, and there's no need to adjust the default read voltage. The offset should be 0. If the number P is 14240, which is smaller than $$\frac{7}{8}M$$

and larger than $$\frac{3}{4}M,$$

the degree of the charge loss corresponding to 14240 is D2, an offset of −120 mV should be applied to the memory cells in L7 state. If the number P is 3072, which is smaller than $$\frac{1}{4}M$$

and larger than $$\frac{1}{8}M,$$

the degree of the charge loss corresponding to 3072 is D5, an offset of −300 mV should be applied to the memory cells in L7 state. If the number P is 1120, which is smaller than $$\frac{1}{16}M,$$

the degree of the charge loss corresponding to 3072 is D7, which means the charge loss of the unit is too serious to be compensated, and the data stored in the unit need to be relocated.

Figure 12:
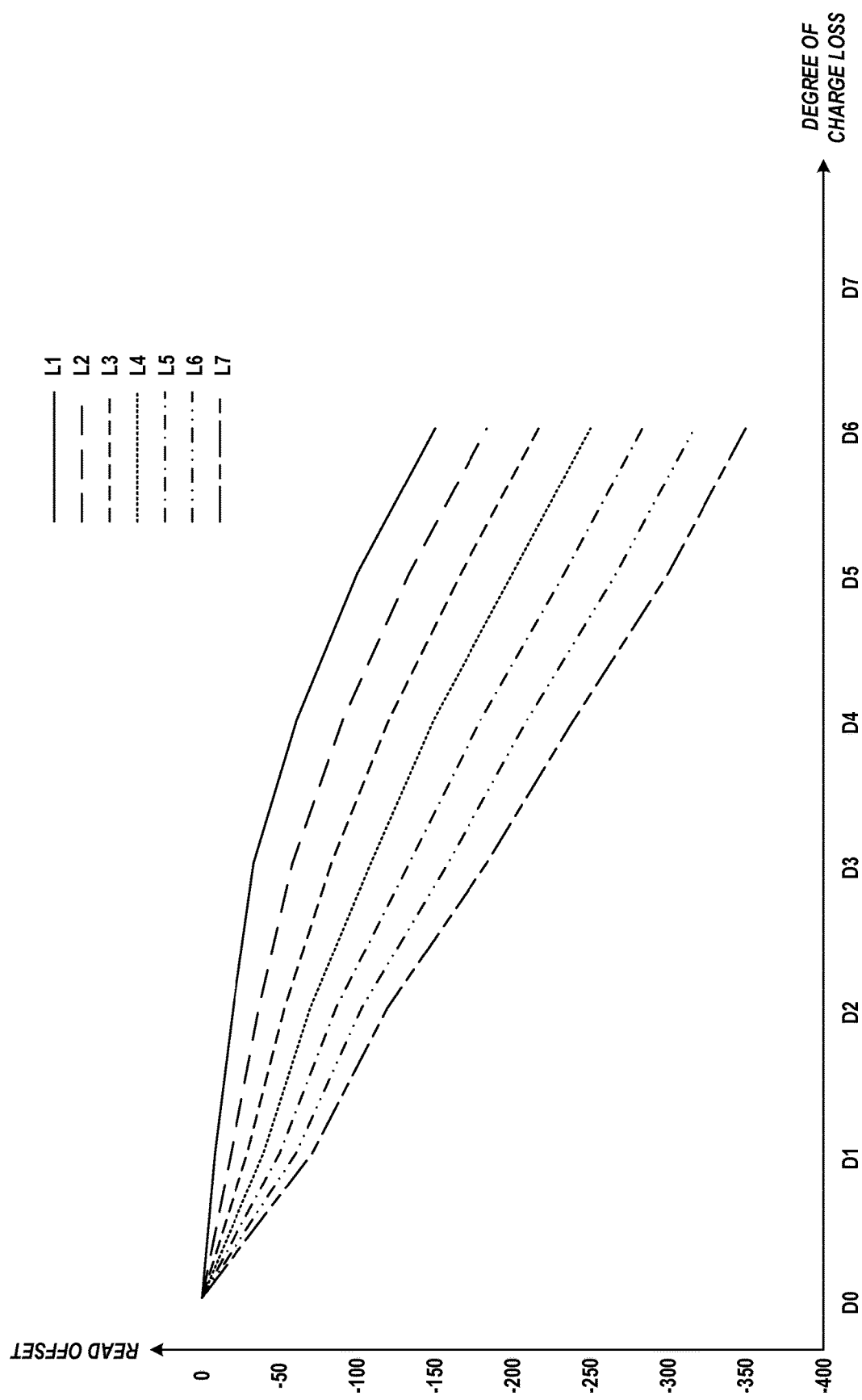
FIG. 12 illustrates a plot of offsets of programming states and a number P of memory cells.

For memory cells suffering from the same degree of charge loss, the higher the threshold voltage of the memory cell is, the more serious the threshold decrease will be. Thus, it is necessary to adjust the offset based on a default threshold voltage of the memory cell, and the adjusted offset of the memory cell in the unit is positively related to the default threshold voltage of the memory cell. For example, for a D2 degree of charge loss, the offset for a memory cell in the L7 state is −120 mV, and an offset for a memory cell in the L4 state should be −60 mV, an offset for a memory cell in the L1 state should be −20 mV. The relationship between the offset and the charge loss degree of memory cells in different states are illustrated in FIG. 12. For other MLC devices, for example, QLC device, the relationship between the offset and the charge loss degree of memory cells in different states has a similar trend to the one shown in FIG. 12.

After the offset of a unit is obtained, it will be stored in an index table as illustrated in FIG. 13. As the degrees of charge loss in different units are different, the offsets of different units are also different. For example, the degree of charge loss of unit 1 is DO, which means memory cells in unit 1 do not suffer from charge loss, and the offsets for each memory cell of unit 1 is 0. The degree of charge loss of unit 2 is D5, which means memory cells in unit 2 suffer from serious, but not fatal, charge loss and need offsets. Referring to FIG. 13, for memory cells in unit 2, the offset for memory cells in level 1 is −130 mV, the offset for memory cells in level 3 is −200 mV, the offset for memory cells in level 7 is −300 mV. If the degree of charge loss of a unit is D7, which means the memory cells in the unit suffer from severe and fatal charge loss and may not able to read data correctly, like unit 3, then the data in unit 3 needs to be relocated. The index table in FIG. 13 is stored in a register or the SRAM and will be updated periodically by running the verify reading operation. For every read operation, the index table will be accessed to get a corresponding offset to avoid reading errors, thus the efficiency of the memory device is greatly improved because time required to access the index table is negligible.

Figure 9B:
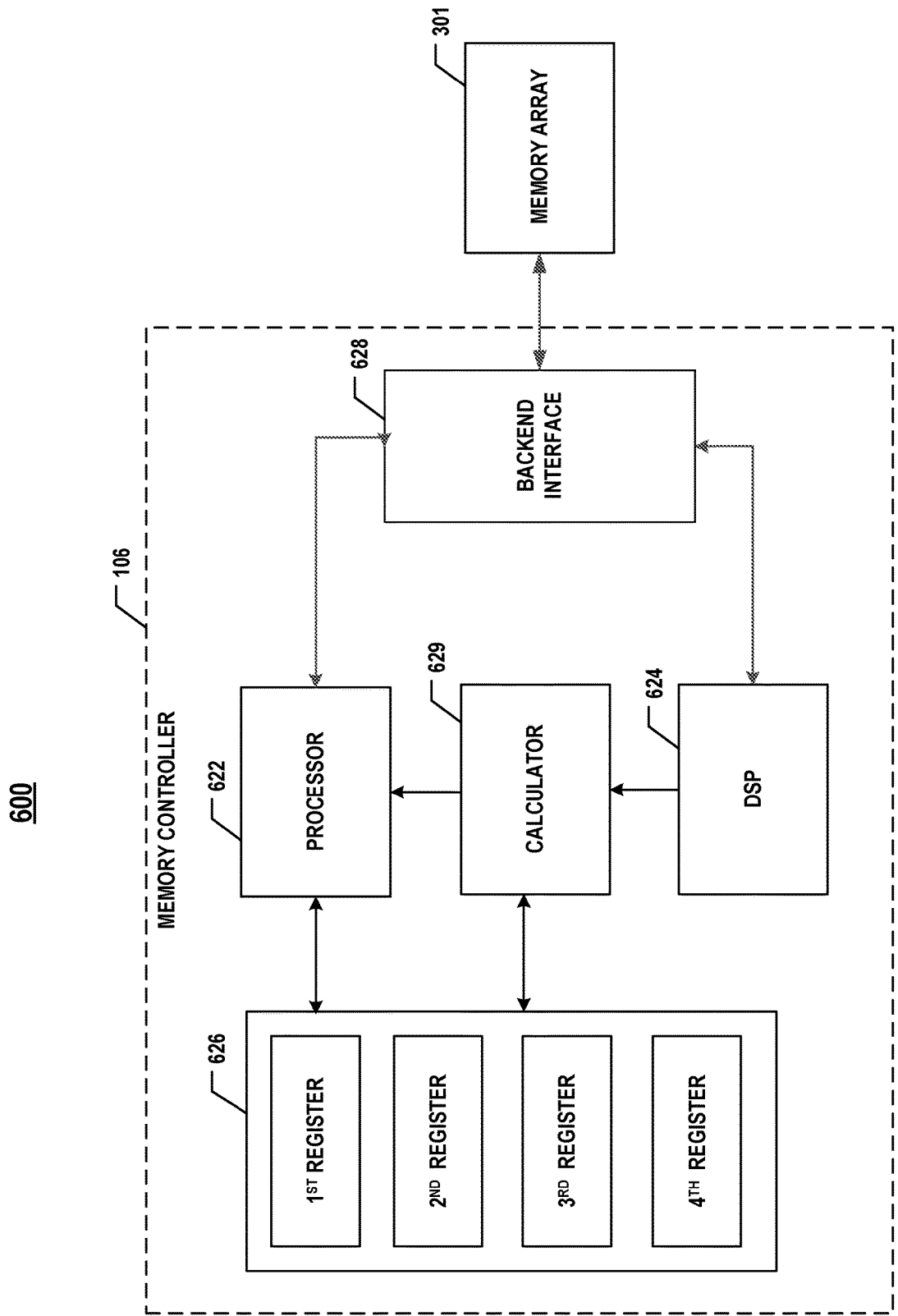
FIG. 9B illustrates a block diagram of another memory controller coupled to a memory cell array, according to some aspects of the present disclosure.

FIG. 9B illustrates another implementation of the present disclosure, in which a number difference ΔP between the number P with a default number P' is calculated. The default number P' is the number of memory cells in the unit that are in the one or more programmed states of the $2^N$ states after a program operation are completed. As described above, in a unit including 4 18 kB NAND page, the number P of the memory cells in the state L7 equals a default number P' of the memory cells in the state L7, which is 73728 bits. In this implementation, processor 622 is configured to obtain the offset through a look up operation by looking up the offset corresponding to the number difference ΔP in a second mapping table between the offset and the number difference ΔP. The second mapping table is stored in a second register of register 626, and the default number P' is stored in a third register of register 626. Memory controller 106 further includes a calculator 629 coupled to processor 622 and DSP 624. Calculator 629 is configured to calculate the number difference ΔP based on the default number P' stored in a third register and the number P obtained by DSP 624. The number difference ΔP is then sent to processor 622 to determine an offset based on the number difference ΔP and the second mapping table. The number difference ΔP employed in this implementation has the same function as the number P in the implementation above, i.e., to reflect the charge loss through the change of the number in a selected state. Approaches to counting the number difference ΔP and the number P are different, and both can be achieved through multiple ways. The implementations described above are illustrative and should not be interpreted as a limitation of the present disclosure.

Figure 14A:
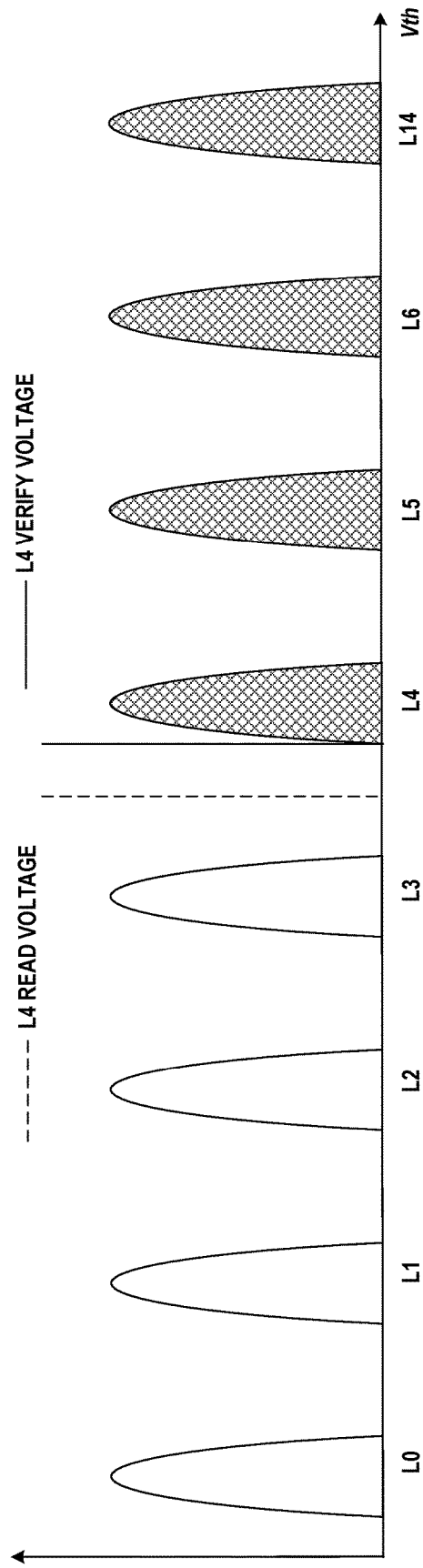
FIG. 14A illustrates a diagram of the relationship between a verify voltage and threshold voltage distributions without charge loss.
Figure 14B:
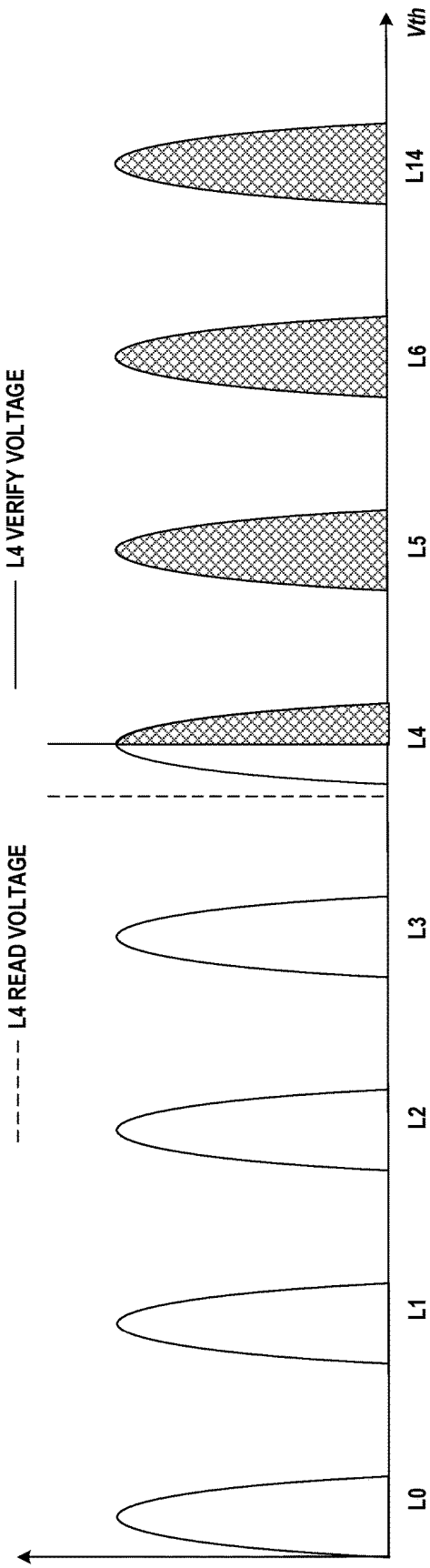
FIG. 14B illustrates a diagram of relationship between a verify voltage and threshold voltage distributions with charge loss.

FIG. 14A and FIG. 14B illustrate some implementations of the present disclosure, in which four programmed states, not one, are selected to reflect the change of number P. The verify voltage is set as the minimum threshold voltage of the memory cells in all the states from L4 to L7, i.e., the minimum threshold voltage of the memory cells in state L4. The memory cells from L4 state to L7 state will be in the first state and feedback a data "0" when applied with the verify voltage. When the threshold voltage distributions shifted due to charge loss, the number P of the memory cells will be decreased under the verify voltage, as shown in FIG. 14B. Thus, the offset can be tailor-made based on the number P. The verify reading operation is the same as described above, and will not be repeated here.

The memory system of the present disclosure can detect the accurate degree of charge loss, and tailor-made an offset to compensate for the charge loss in read operations. Thus, error recoveries are avoided, and the time consumed by each read operation is greatly saved. The performance of the memory system is improved significantly.

FIG. 9A and FIG. 9B illustrate different implementations of memory controller 106 coupled to memory cell array 301 of memory cells, as shown in FIG. 7. Each memory cell is set to one of $2^N$ states corresponding to a piece of N-bits data, where N is an integer greater than 1, and the array of memory cells is partitioned into one or more units.

In FIG. 9A, memory controller 106 is coupled to a memory device to address the prementioned issues. Memory controller 106 is coupled to memory cell array 301 and is configured to, upon executing instructions: obtain, from memory cell array 301, a number P of memory cells in a unit of the units that are in one or more programmed states of the $2^N$ states; calculate, based on the number P, a compensated read voltage with an offset from a default read voltage; and provide, to the memory device, the compensated read voltage for a read operation performed on a selected memory cell of the memory cells in a unit of the units. Referring to FIG. 9A, memory controller 106 includes processor 622 and DSP 624 coupled to backend interface 628. Processor 622 is configured to control memory cell array 301 to count the number P of memory cells in the unit by running a verify reading operation. DSP 624 is configured to count the number P after the verify voltage is applied to at least part of the memory cells in the unit. Memory controller 106 further includes a register 626 configured to store a first mapping table and the offset. The first mapping table and the offset can be stored in the same register or different registers, depending on the size of the register. In the present implementation, the first mapping table is stored in a first register, and the offset is stored in a fourth register. In FIG. 9B, memory controller further includes a calculator 629 coupled to processor 622 and DSP 624. The number difference ΔP is then sent to processor 622 to determine an offset based on the number difference ΔP and the second mapping table. The number difference ΔP employed in this implementation has the same function as the number P in the implementation above, i.e., to reflect the charge loss through the change of the number in a selected state.

FIG. 9B illustrates another implementation of the present disclosure, in which a number difference ΔP between the number P with a default number P' is calculated. The default number P' is the number of memory cells in the unit that are in the one or more programmed states of the $2^N$ states after a program operation is completed. Processor 622 is configured to obtain the offset through a look up operation by looking up the offset corresponding to the number difference ΔP in a second mapping table between the offset and the number difference ΔP. The second mapping table is stored in a second register of register 626, and the default number P' is stored in a third register of register 626. Memory controller 106 further includes a calculator 629 coupled to processor 622 and DSP 624. Calculator 629 is configured to calculate the number difference ΔP based on the default number P' stored in a third register and the number P obtained by DSP 624. The number difference ΔP is then sent to processor 622 to determine an offset based on the number difference ΔP and the second mapping table. The number difference ΔP employed in this implementation has the same function as the number P in the implementation above, i.e., to reflect the charge loss through the change of the number in a selected state. Approaches to counting the number difference ΔP and the number P are different, and both can be achieved through multiple ways. The implementations described above are illustrative and should not be interpreted as a limitation of the present disclosure.

In some implementations of the present disclosure, an offset that can compensate for charge loss accurately can be provided by the memory device without participation of the memory controller. As shown in FIG. 7, memory device 104 includes an array 301 of memory cells and peripheral circuit 302. Each memory cell is configured to be set to one of $2^N$ states corresponding to a piece of N-bit data, where N is an integer greater than 1, and array 301 of memory cells is partitioned into one or more units. Peripheral circuit 302 is coupled to the memory cells and configured to perform a read operation on a selected memory cell of the memory cells in a unit of the units using a compensated read voltage with an offset from a default read voltage. The offset is correlated with a number P of memory cells in the unit that are in one or more programmed states of the $2^N$ states.

Taking a TLC device as an example, referring to FIG. 10A and FIG. 10B, eight states can be stored in a TLC unit in which L0 is an erased state and L1 to L7 are seven programmed states. In the present implementation, the number of the selected one or more programmed states of the $2^N$ is one, i.e., the minimum threshold voltage of the default range of threshold voltages corresponding to the selected state is higher than a threshold voltage of memory cells corresponding to unselected states of the $2^N$ states. The highest level, L7, is selected, and the corresponding L7 verify voltage equals the minimum threshold voltage of L7. In the verify reading operation, the verify voltage is applied to at least part of the memory cells in the unit through word line 318 driven by the word line driver 408. When the L7 verify voltage is applied to the unit after the program operation is just finished, the number P of the memory cells in the state L7 equals a default number P'. Since there is a scrambler to randomize the data pattern in each program operation, the number of the memory cells in each state of the eight states is close. For example, in an 18 KB NAND page, there are 18×1024×8=147456 bits in total, and the number of the memory cells in each state of the eight states is 147456/8=18432 bits. For a unit including 1 page, the number of the memory cells in each state of the eight states is 18432× 1=18432 bits. For a unit including 4 pages, the number of the memory cells in each state of the eight states is 18432×4=73728 bits. For a unit including 8 pages, the number of the memory cells in each state of the eight states is 18432× 8=147456 bits. In the present implementation, taking a unit including 4 pages as an example, after the unit is just programmed, the number P of the memory cells in the state L7 equals a default number P' of the memory cells in the state L7, which is 73728 bits.

As time goes on, more and more electrons de-trapped on the cells because of charge loss. Therefore, the threshold voltage distributions shift down, i.e., L7 shifts left, and the number cell number P decreases. After the L7 verify voltage is applied to at least part of the memory cells in the unit, the number P is counted by a calculator of peripheral circuit 302. As shown in FIG. 10B, as the threshold voltage distributions shift left, the number P of the memory cells in L7 is less than the default number P' under the same verify voltage. To address the offset to compensate for the charge loss, control logic 412 sends instructions to memory cell array 301 to control memory cell array 301 to count the number P of memory cells in L7 state by running the verify reading operation. The verify voltage used in the verify reading operation is confirmed by control logic 412 as described above, i.e., the minimum threshold voltage of the memory cells in L7 state.

After the verify reading operation is completed, the page buffer counts the number P. For memory cells coupled to the same bit line, the number of the memory cells and a current generated by each memory cell in L7 state are stored in registers 414, total current generated under verify voltage can be tested by the page buffer, the number of the memory cells in L7 is proportional to the current tested by the page buffer. In some implementations, each unit of the one or more units includes one or more pages, the verify reading operation is performed on one or more selected pages of the one or more pages, and the number P is an average number of memory cells in the one or more selected pages that are in one or more programmed states of the $2^N$ states. The verify reading operation is performed page by page, i.e., memory cells driven by a same bit line will be verified in a same verify reading operation. For a unit includes a plurality of pages, sampling part, not all, of the pages can improve verify efficiency. For example, unit 1 includes 1024 pages which are written through the same write operation, running the verify reading operation on all the 1024 pages is time-consuming. As charge loss is strongly related to the period after the last write operation, pages in the same unit have a similar degree of charge loss. Thus, it is reasonable to sample few pages of the 1024 pages to obtain the number P. For example, selected one page to run the verify reading operation. In other implementation, two or more pages can be selected to run the verify reading operation, and the number P can be obtained by averaging the number of memory cells in the selected pages that are in the selected state to reduce errors.

After the number P is confirmed, control logic 412 is able to obtain the offset through a look up operation by looking up the offset corresponding to the number P in a first mapping table between the offset and the number P. The first mapping table is stored in a first register of registers 414. FIG. 11 illustrates an example of the first mapping table, where M is the number of memory cells in a unit of the units that are in one or more programmed states of the $2^N$ states. In the present implementation, M is the number of memory cells in the unit that are in L7 state after the unit is just programmed, i.e., 18432. The degree of charge loss is divided into eight levels, ranging from D0 to D7, based on the number P counted by the page buffer. As shown in FIG. 11, if the number P is 18340, which is smaller than M and larger than $$\frac{15}{15}M,$$

the degree of the charge loss corresponding to 18340 is D0, which is slight, and there's no need to adjust the default read voltage, the offset should be 0. If the number P is 14240, which is smaller than $$\frac{7}{8}M$$

and larger than $$\frac{3}{4}M,$$

the degree of the charge loss corresponding to 14240 is D2, an offset of −120 mV should be applied to the memory cells in L7 state. If the number P is 3072, which is smaller than $$\frac{1}{4}M$$

and larger than $$\frac{1}{8}M,$$

the degree of the charge loss corresponding to 3072 is D5, an offset of −300 mV should be applied to the memory cells in L7 state. If the number P is 1120, which is smaller than $$\frac{1}{16}M,$$

the degree of the charge loss corresponding to 3072 is D7, which means the charge loss of the unit is too serious to be compensated, and the data stored in the unit need to be relocated.

For memory cells suffering from the same degree of charge loss, the higher the threshold voltage of the memory cell is, the more serious the threshold decrease will be. Thus, it is necessary to adjust the offset based on a default threshold voltage of the memory cell, and the adjusted offset of the memory cell in the unit is positively related to the default threshold voltage of the memory cell. For example, for a D2 degree of charge loss, the offset for a memory cell in the L7 state is −120 mV, and an offset for a memory cell in the L4 state should be −60 mV, an offset for a memory cell in the L1 state should be −20 mV. The relationship between the offset and the charge loss degree of memory cells in different states is illustrated in FIG. 12. For other MLC devices, for example, QLC device, the relationship between the offset and the charge loss degree of memory cells in different states has a similar trend to the one shown in FIG. 12.

After the offset of a unit is obtained, it will be stored in an index table as illustrated in FIG. 13. As the degrees of charge loss in different units are different, the offsets of different units are also different. For example, the degree of charge loss of unit 1 is D0, which means memory cells in unit 1 do not suffer from charge loss, and the offsets for each memory cell of unit 1 is 0. The degree of charge loss of unit 2 is D5, which means memory cells in unit 2 suffer from serious, but not fatal, charge loss and need offsets. Referring to FIG. 13, for memory cells in unit 2, the offset for memory cells in level 1 is −130 mV, the offset for memory cells in level 3 is −200 mV, the offset for memory cells in level 7 is −300 mV. If the degree of charge loss of a unit is D7, which means the memory cells in the unit suffer from severe and fatal charge loss and may not able to read data correctly, like unit 3, then the data in unit 3 needs to be relocated. The index table in FIG. 13 is stored in a register or the SRAM and will be updated periodically by running the verify reading operation. For every read operation, the index table will be accessed to get a corresponding offset to avoid reading errors, thus the efficiency of the memory device is greatly improved because time required to access the index table is negligible.

In another implementation of the present disclosure, a number difference ΔP between the number P with a default number P' is calculated. The default number P' is the number of memory cells in the unit that are in the one or more programmed states of the $2^N$ states after a program operation is completed. As discussed above, in the unit including four 18 KB NAND pages, the number P of the memory cells in the state L7 equals a default number P' of the memory cells in the state L7, which is 73728 bits. In this implementation, the control logic 412 is configured to obtain the offset through a look up operation by looking up the offset corresponding to the number difference ΔP in a second mapping table between the offset and the number difference ΔP. The second mapping table is stored in a second register of registers 414, and the default number P' is stored in a third register of register 414. Control logic 412 further includes a calculator configured to calculate the number difference ΔP based on the default number P' stored in a third register and the number P obtained. The number difference ΔP is then used to determine an offset based on the number difference ΔP and the second mapping table. The number difference ΔP employed in this implementation has the same function as the number P in the implementation above, i.e., to reflect the charge loss through the change of the number in a selected state. Approaches to counting the number difference ΔP and the number P are different, and both can be achieved through multiple ways. The implementations described above are illustrative and should not be interpreted as a limitation of the present disclosure.

Figure 15:
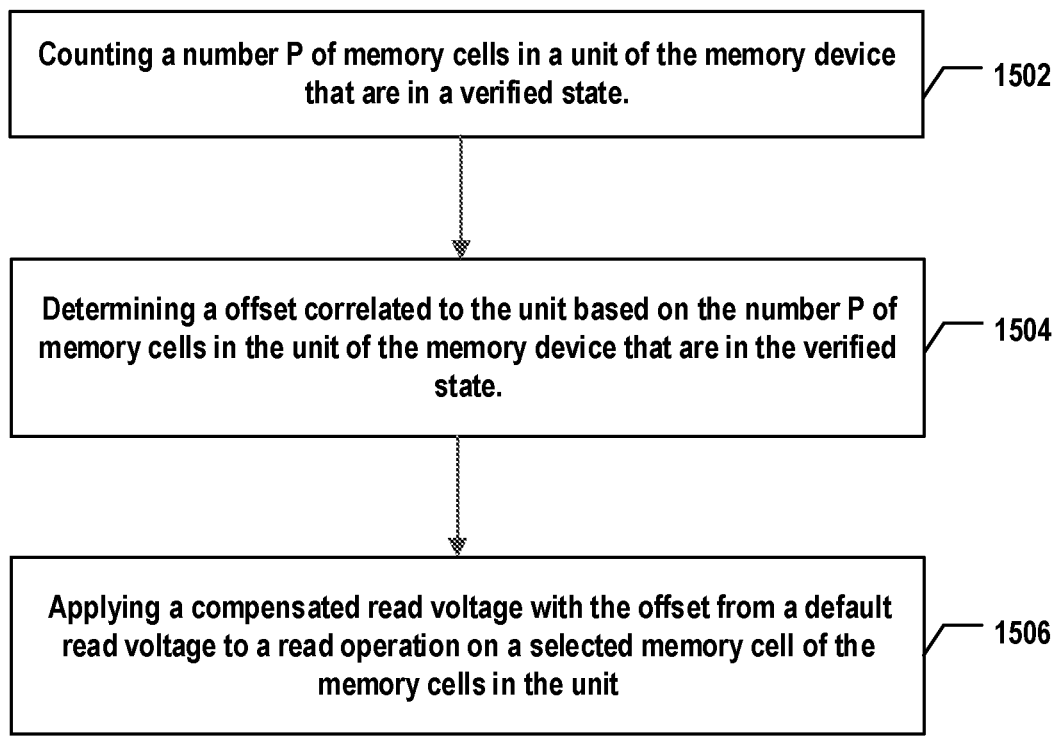
FIG. 15 illustrates a flowchart of a method for read offset compensation based on the number P of memory cells, according to some aspects of the present disclosure.

FIG. 15 illustrates a flowchart of a method 1500 for operating a memory device, according to some aspects of the present disclosure. The memory device may be any suitable memory device disclosed herein, such as memory device 104. Memory device 104 includes an array 301 of memory cells being configured to be set to one of $2^N$ states corresponding to a piece of N-bit data, where N is an integer greater than 1, and the array 301 of memory cells is partitioned into one or more units. Method 1500 may be implemented by peripheral circuit 302, such as row decoder/word line driver 408, voltage generator 410, control logic 412, and register 414. Method 1500 may be implemented by memory controller 106, such as processor 622, DSP 624, and registers 626. It is understood that the operations shown in method 1500 may not be exhaustive and that other operations can be performed as well before, after, or between any of the illustrated operations. Further, some of the operations may be performed simultaneously, or in a different order than shown in FIG. 15.

Referring to FIG. 15, method 1500 starts at operation 1502, in which a number P of memory cells in a unit that are in one or more programmed states of the $2^N$ states is obtained. Taking a TLC device as an example, referring to FIG. 10A and FIG. 10B, eight states can be stored in a TLC unit in which L0 is an erased state and L1 to L7 are seven programmed states. In the present implementation, the number of the selected one or more programmed states of the $2^N$ is one, i.e., the minimum threshold voltage of the default range of threshold voltages corresponding to the selected state is higher than a threshold voltage of memory cells corresponding to unselected states of the $2^N$ states. The highest level, L7, is selected, and the corresponding L7 verify voltage equals the minimum threshold voltage of L7. In the verify reading operation, the verify voltage is applied to at least part of the memory cells in the unit through word line 318 driven by the word line driver 408. When the L7 verify voltage is applied to the unit after the program operation is just finished, the number P of the memory cells in the state L7 equals a default number P'. Since there is a scrambler to randomize the data pattern in each program operation, the number of the memory cells in each state of the eight states is close. For example, in an 18 KB NAND page, there are 18×1024×8=147456 bits in total, and the number of the memory cells in each state of the eight states is 147456/8=18432 bits. For a unit including 1 page, the number of the memory cells in each state of the eight states is 18432× 1=18432 bits. For a unit including 4 pages, the number of the memory cells in each state of the eight states is 18432×4=73728 bits. For a unit including 8 pages, the number of the memory cells in each state of the eight states is 18432× 8=147456 bits. In the present implementation, taking a unit including 4 pages as an example, after the unit is just programmed, the number P of the memory cells in the state L7 equals the default number P' of the memory cells in the state L7, which is 73728 bits.

As time goes on, more and more electrons de-trapped on the cells because of charge loss. Therefore, the threshold voltage distributions shift down, i.e., L7 shifts left, and the number cell number P decreases. After the L7 verify voltage is applied to at least part of the memory cells in the unit, the number P is counted. As shown in FIG. 10B, as the threshold voltage distributions shift left, the number P of the memory cells in L7 is less than the default number P' under the same verify voltage. To address the offset to compensate for the charge loss, the verify reading operation is run. The verify voltage used in the verify reading operation is confirmed as described above, i.e., the minimum threshold voltage of the memory cells in L7 state.

After the verify reading operation is completed, the page buffer counts the number P. For memory cells coupled to the same bit line, the number of the memory cells and a current generated by each memory cell in L7 state are stored in registers. Total current generated under verify voltage can be tested by the page buffer, the number of the memory cells in L7 is proportional to the current tested by the page buffer. In some implementations, each unit of the one or more units includes one or more pages, the verify reading operation is performed on one or more selected pages of the one or more pages, and the number P is an average number of memory cells in the one or more selected pages that are in one or more programmed states of the $2^N$ states. The verify reading operation is performed page by page, i.e., memory cells driven by a same bit line will be verified in a same verify reading operation. For a unit includes a plurality of pages, sampling part, not all, of the pages can improve verify efficiency. For example, unit 1 includes 1024 pages which are written through a same write operation, running the verify reading operation on all the 1024 pages is time-consuming. As charge loss is strongly related to the period after the last write operation, pages in the same unit have a similar degree of charge loss. Thus, it is reasonable to sample few pages of the 1024 pages to obtain the number P. For example, selected one page to run the verify reading operation. In other implementation, two or more pages can be selected to run the verify reading operation, and the number P can be obtained by averaging the number of memory cells in the selected pages that are in the selected state to reduce errors.

Method 1500 proceeds to operation 1504, as illustrated in FIG. 15, in which a compensated read voltage with an offset from a default read voltage is obtained. After the number P is confirmed, the offset is obtained through a look up operation by looking up the offset corresponding to the number P in a first mapping table between the offset and the number P. The first mapping table is stored in a first register of registers. FIG. 11 illustrates an example of the first mapping table, where M corresponds to the number P. Which means, M is the number of memory cells in the unit when P is the number of memory cells in the unit that are in one or more programmed states of the $2^N$ states, and M is the number of memory cells in a selected page of the unit when P is the number of memory cells in the selected page that are in one or more programmed states of the $2^N$ states. In the present implementation, only part, but not all, of the pages in the unit is selected to run the verify reading operation, where M is the number of memory cells in the selected page a unit of the units that are in one or more programmed states of the $2^N$ states. In another implementation, all pages in the unit are selected to run the verify reading operation, then M is the number of memory cells in the unit that are in one or more programmed states of the $2^N$ states. In the present implementation, M is the number of memory cells in the selected page that are in L7 state after the selected page is just programmed, i.e., 18432. The degree of charge loss is divided into eight levels, ranging from D0 to D7, based on the number P counted by the page buffer. As shown in FIG. 11, if the number P is 18340, which is smaller than M and larger than $$\frac{15}{16}M,$$

the degree of the charge loss corresponding to 18340 is D0, which is slight, and there's no need to adjust the default read voltage, the offset should be 0. If the number P is 14240, which is smaller than $$\frac{7}{8}M$$

and larger than $$\frac{3}{4}M,$$

the degree of the charge loss corresponding to 14240 is D0, an offset of −120 mV should be applied to the memory cells in L7 state. If the number P is 3072, which is smaller than $$\frac{1}{4}M$$

and larger than $$\frac{1}{8}M,$$

the degree of charge loss corresponding to 3072 is D5, an offset of −300 mV should be applied to the memory cells in L7 state. If the number P is 1120, which is smaller than $$\frac{1}{16}M,$$

the degree of the charge loss corresponding to 3072 is D7, which means the charge loss of the unit is too serious to be compensated, and the data stored in the unit need to be relocated.

For memory cells suffering from the same degree of charge loss, the higher the threshold voltage of the memory cell is, the more serious the threshold decrease will be. Thus, it is necessary to adjust the offset based on a default threshold voltage of the memory cell, and the adjusted offset of the memory cell in the unit is positively related to the default threshold voltage of the memory cell. For example, for a D2 degree of charge loss, the offset for a memory cell in the L7 state is −120 mV, and an offset for a memory cell in the L4 state should be −60 mV, an offset for a memory cell in the L1 state should be −20 mV. The relationship between the offset and the charge loss degree of memory cells in different states is illustrated in FIG. 12. For other MLC devices, for example, QLC device, the relationship between the offset and the charge loss degree of memory cells in different states has a similar trend to the one shown in FIG. 12.

In another implementation of the present disclosure, a number difference ΔP between the number P with a default number P' is calculated. The default number P' is the number of memory cells in the unit that are in the one or more programmed states of the $2^N$ states after a program operation is completed. As discussed above, in the unit including four 18 KB NAND pages, the number P of the memory cells in the state L7 equals a default number P' of the memory cells in the state L7, which is 73728 bits. In this implementation, the offset is obtained through a look up operation by looking up the offset corresponding to the number difference ΔP in a second mapping table between the offset and the number difference ΔP. The second mapping table is stored in a second register of registers, and the default number P' is stored in a third register of registers. The number difference ΔP is then calculated based on the default number P' stored in a third register and the number P obtained. The number difference ΔP is then used to determine an offset based on the number difference ΔP and the second mapping table. The number difference ΔP employed in this implementation has the same function as the number P in the implementation above, i.e., to reflect the charge loss through the change of the number in a selected state. The approaches to counting the number difference ΔP and the number P are different, and both can be achieved through multiple ways. The implementations described above are illustrative and should not be interpreted as a limitation of the present disclosure.

Method 1500 proceeds to operation 1506, as illustrated in FIG. 15, in which a read operation is performed with the compensated read voltage on a selected memory cell of the memory cells in the unit.

By viewing an MLC unit as a single level cell (SLC) unit and running a verify reading operation to confirm the actual charge loss of a certain unit, the present disclosure is able to confirm a tailor-made offset to compensate the default read voltage of a read operation. Error recoveries are avoided, and the time consumed by each read operation is greatly saved. The performance of the memory system is improved significantly.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described implementations, but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A memory system, comprising:
   a memory device comprising:
      an array of memory cells, each memory cell of the array being configured to be set to one of $2^N$ states corresponding to a piece of N-bit data, where N is an integer greater than 1, and the array of memory cells is partitioned into one or more units, and a peripheral circuit coupled to the memory cells and configured to perform a read operation on a selected memory cell of the memory cells in a unit of the one or more units; and a memory controller coupled to the memory device and configured to:

determine a voltage offset based on a first mapping table containing values of a number P of memory cells in the unit of the one or more units that are in one or more programmed states of the $2^N$ states and values of the voltage offset corresponding to the values of the number P, and control the memory device to perform the read operation using a compensated read voltage with the voltage offset from a default read voltage by sending instructions to the peripheral circuit.

2. The memory system of claim 1, wherein the voltage offset is associated with the unit of the one or more units and is updated after the number P of memory cells in the unit of the one or more units changes.

3. The memory system of claim 2, wherein the voltage offset is updated periodically.

4. The memory system of claim 1, wherein the number P is obtained through a verify reading operation configured to count the number P of memory cells in the unit of the one or more units.

5. The memory system of claim 4, wherein the memory controller is configured to:

select the one or more programmed states of the $2^N$ states; and determine a verify voltage used in the verify reading operation based on a default range of threshold voltages corresponding to the one or more programmed states being selected; and the verify voltage is equal to a minimum threshold voltage of the default range of threshold voltages corresponding to the one or more programmed states being selected.

6. The memory system of claim 5, wherein, a number of the selected one or more programmed states of the $2^N$ is one; and the minimum threshold voltage of the default range of threshold voltages corresponding to the one or more programmed states being selected is higher than a threshold voltage of memory cells corresponding to unselected states of the $2^N$ states.

7. The memory system of claim 5, wherein the peripheral circuit comprises a word line driver configured to apply the verify voltage to at least part of the memory cells in the unit of the one or more units through a word line; and the memory controller comprises a digital signal processor configured to count the number P after the verify voltage is applied to at least part of the memory cells in the unit of the one or more units.

8. The memory system of claim 4, wherein each unit of the one or more units comprises one or more page, the verify reading operation is performed on one or more selected pages of the one or more pages, and the number P is an average number of memory cells in the one or more selected pages that are in the one or more programmed states of the $2^N$ states.

9. The memory system of claim 1, wherein the first mapping table further comprises:

a pre-calculated relationship between the values of the voltage offset and the values of the number P of the memory cells that are in the one or more programmed states of the $2^N$ states.

10. The memory system of claim 1, wherein the memory controller is configured to calculate a number difference ΔP between the number P with a default number P', the default number P' equals to a number of memory cells in the unit of the one or more units that are in the one or more programmed states of the $2^N$ states after a program operation is completed.

11. The memory system of claim 10, wherein the memory controller is configured to determine the voltage offset based on a second mapping table containing values of the number difference ΔP and values of the voltage offset corresponding to values of the number difference ΔP.

12. The memory system of claim 1, wherein the memory controller is configured to, for a memory cell in the unit of the one or more units, adjust the voltage offset based on a default threshold voltage of the memory cell.

13. The memory system of claim 12, wherein the adjusted voltage offset of the memory cell in the unit of the one or more units is positively related to the default threshold voltage of the memory cell.

14. The memory system of claim 13, wherein the memory controller is configured to retrieve the voltage offset from a fourth register and calculate the compensated read voltage by adding the voltage offset to the default read voltage.

15. A memory controller, coupled to a memory device comprising an array of memory cells, each memory cell of the array being set to one of $2^N$ states corresponding to a piece of N-bits data, where N is an integer greater than 1, and the array of memory cells being partitioned into one or more units, wherein the memory controller is coupled to the memory device and configured to, upon executing instructions:

obtain, from the memory device, a number P of memory cells in a unit of the one or more units that are in one or more programmed states of the $2^N$ states;

determine a voltage offset corresponding to the number P through a look up operation based on a first mapping table containing values of a number of memory cells in the unit that are in one or more programmed states of the $2^N$ states and values of the voltage offset corresponding to the values of the number P;

calculate, based on the number P, a compensated read voltage with the voltage offset from a default read voltage; and provide, to the memory device, the compensated read voltage for a read operation performed on a selected memory cell of the memory cells in a unit of the one or more units.

16. The memory controller of claim 15, wherein the voltage offset is associated with the unit of the one or more units and is updated after the number P of memory cells in the unit of the one or more units changed.

17. The memory controller of claim 16, wherein the first mapping table and the voltage offset are updated periodically.

18. The memory controller of claim 15, further comprising a processor configured to control the memory device to count the number P of memory cells in the unit by running a verify reading operation, and the processor is configured to:

select one or more programmed states of the $2^N$ states; and determine a verify voltage used in the verify reading operation based on a default range of threshold voltages corresponding to the one or more programmed states being selected; and the verify voltage is equal to a minimum threshold voltage of the default range of threshold voltages corresponding to the one or more programmed states being selected.

19. The memory controller of claim 18, wherein a number of the selected one or more programmed states of the $2^N$ is one, and the minimum threshold voltage of the default range of threshold voltages corresponding to the one or more programmed states being selected is higher than a threshold voltage of memory cells corresponding to unselected states of the $2^N$ states.

20. A method for reading a memory device comprising an array of memory cells being configured to be set to one of $2^N$ states corresponding to a piece of N-bit data, where N is an integer greater than 1, the array of memory cells being partitioned into one or more units, the method comprising:

obtaining a number P of memory cells in a unit of the one or more units that are in one or more programmed states of the $2^N$ states;

determining a voltage offset corresponding to the number P through a look up operation based on a first mapping table containing values of a number of memory cells in the unit of the one or more units that are in one or more programmed states of the $2^N$ states and values of the voltage offset corresponding to the values of the number P;

calculating a compensated read voltage with the voltage offset from a default read voltage; and performing a read operation with the compensated read voltage on a selected memory cell of the memory cells in the unit of the one or more units.

* * * * *